(12) United States Patent
Okuyama

(10) Patent No.: US 8,987,021 B2
(45) Date of Patent: Mar. 24, 2015

(54) MANUFACTURING METHOD OF LIGHT-EMITTING DEVICE

(71) Applicant: Toyoda Gosei Co., Ltd., Aichi-ken (JP)

(72) Inventor: Mineo Okuyama, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/911,450

(22) Filed: Jun. 6, 2013

(65) Prior Publication Data

US 2013/0330852 A1    Dec. 12, 2013

(30) Foreign Application Priority Data

Jun. 8, 2012    (JP) .................................. 2012-130846

(51) Int. Cl.
*H01L 33/62*    (2010.01)
*H01L 23/00*    (2006.01)

(52) U.S. Cl.
CPC .............. *H01L 33/62* (2013.01); *H01L 24/85* (2013.01); *H01L 24/05* (2013.01); *H01L 24/06* (2013.01); *H01L 24/48* (2013.01); *H01L 2933/0033* (2013.01); *H01L 2224/32257* (2013.01); *H01L 2224/32245* (2013.01); *H01L 2224/48091* (2013.01); *H01L 2224/48247* (2013.01); *H01L 2224/48257* (2013.01); *H01L 2224/48463* (2013.01); *H01L 2224/49107* (2013.01); *H01L 2224/49113* (2013.01); *H01L 2224/73265* (2013.01); *H01L 2224/45144* (2013.01); *H01L 2224/45015* (2013.01); *H01L 24/29* (2013.01); *H01L 24/32* (2013.01); *H01L 24/45* (2013.01); *H01L 24/49* (2013.01); *H01L 24/73* (2013.01); *H01L 2224/05144* (2013.01); *H01L 2224/05655* (2013.01); *H01L 2224/05681* (2013.01); *H01L 2224/2919* (2013.01); *H01L 2224/83862* (2013.01); *H01L 2224/8501* (2013.01); *H01L 2224/85013* (2013.01); *H01L 2224/85375* (2013.01); *H01L 2224/92247* (2013.01)
USPC ........... 438/26; 438/22; 438/28; 257/E21.001

(58) Field of Classification Search
USPC ............................................................ 438/26
See application file for complete search history.

(56) References Cited

U.S. PATENT DOCUMENTS

| 8,101,965 B2 * | 1/2012 | Kim et al. ........................ 257/99 |
| 2005/0156188 A1 | 7/2005 | Ro et al. |
| 2006/0202217 A1 | 9/2006 | Ro et al. |

(Continued)

FOREIGN PATENT DOCUMENTS

JP    2005-210050 A    8/2005

*Primary Examiner* — Angel Roman
(74) *Attorney, Agent, or Firm* — Sughrue Mion, PLLC

(57) ABSTRACT

A manufacturing method of a light-emitting device includes: a die-bonding process in which a semiconductor light emitting element is placed on a bonding target member via an adhesive containing a silicone resin so that a surface opposite to an exposure surface faces the bonding target member, and the adhesive is heated to bond the semiconductor light emitting element to the bonding target member; and a wire-bonding process in which a wire is connected to the exposure surface. The semiconductor light emitting element includes a laminated semiconductor layer having a light emitting layer and an electrode including a metal layer containing Au and provided on the laminated semiconductor layer and a covering layer containing Ni or Ta and covering the metal layer, the thickness of the covering layer being set smaller than 100 nm and the exposure surface to expose the covering layer to the outside being formed.

9 Claims, 6 Drawing Sheets

(56) References Cited

U.S. PATENT DOCUMENTS

| | | | |
|---|---|---|---|
| 2012/0153342 A1* | 6/2012 | Nishimura et al. | 257/99 |
| 2012/0217534 A1* | 8/2012 | Kamei et al. | 257/99 |
| 2012/0267673 A1* | 10/2012 | Okabe et al. | 257/99 |
| 2013/0256732 A1* | 10/2013 | Miki et al. | 257/98 |

* cited by examiner

MANUFACTURING METHOD OF LIGHT-EMITTING DEVICE

CROSS REFERENCE TO RELATED APPLICATIONS

This application is based on and claims priority under 35 USC §119 from Japanese Patent Application No. 2012-130846 filed Jun. 8, 2012.

BACKGROUND

1. Technical Field

The present invention relates to a manufacturing method of a light-emitting device.

2. Related Art

There is known a semiconductor light emitting element having a laminated semiconductor layer that is configured with a compound semiconductor and includes a light emitting layer for emitting light by passing a current, and electrodes provided on the laminated semiconductor layer to supply electrical power to the laminated semiconductor layer.

Japanese Patent Laid-Open Publication No. 2005-210050 describes a semiconductor light emitting element in which an uppermost layer of an electrode provided on a laminated semiconductor layer is composed of Au.

Incidentally, a semiconductor light emitting element like this is used as a light emitting device by connecting wires to electrodes after die-bonding the semiconductor light emitting element to an object such as a frame by use of an adhesive.

However, in manufacturing the light emitting device, connection failure between the electrodes and wires occurred in some cases because the wires were not bonded to the electrodes of the semiconductor light emitting element or the wires bonded to the electrodes were peeled off.

In particular, in a case where the light emitting element is die-bonded to the frame or the like by use of an adhesive containing a silicone resin, connection failure between the electrodes and the wires is likely to occur.

On the other hand, for example, if an epoxy resin containing no silicone resin is used as an adhesive for die-bonding, connection failure between the electrodes and the wires hardly occurs. However, the epoxy resin is susceptible to deterioration from short-wavelength light with a wavelength of not more than 500 nm, and accordingly, not suitable to be used as the adhesive for die-bonding the semiconductor light emitting element with a light emission wavelength of short wavelength. Consequently, as the adhesive for die-bonding used for the light emitting element with a light emission wavelength of not more than 500 nm, an adhesive containing a silicone resin is preferable in terms of suppressing deterioration from light.

It is an object of the present invention to suppress occurrence of connection failure between the wires and electrodes of the semiconductor light emitting element.

SUMMARY

According to an aspect of the present invention, there is provided a manufacturing method of a light-emitting device, including: a die-bonding process in which a semiconductor light emitting element is placed on a bonding target member via an adhesive containing a silicone resin such that a surface of the semiconductor light emitting element opposite to an exposure surface faces the bonding target member, and the adhesive is heated to bond the semiconductor light emitting element to the bonding target member; and a wire-bonding process in which a wire is connected to the exposure surface in the electrode of the semiconductor light emitting element bonded to the bonding target member. The semiconductor light emitting element includes a semiconductor layer including a light emitting layer that emits light by passing a current, and an electrode including a metal layer composed of a metallic material containing Au and provided on the semiconductor layer and a covering layer composed of a material containing Ni or Ta and covering the metal layer, a thickness of the covering layer being set smaller than 100 nm and the exposure surface for exposing the covering layer to an outside being formed.

Here, in the wire-bonding process, the wire breaks the covering layer and is connected to the metal layer of the semiconductor light emitting element.

Moreover, in the die-bonding process, the semiconductor light emitting element, in which a film structure of the covering layer in the electrode is an island structure, is bonded to the bonding target member.

Further, in the wire-bonding process, the wire composed of a metallic material containing Au is connected to the electrode.

Then, after executing the die-bonding process and before executing the wire-bonding process, a cleaning process for cleaning the exposure surface of the electrode in the semiconductor light emitting element bonded to the bonding target member is included.

Here, the cleaning process includes a process for reducing Ni or Ta in the exposure surface.

Further, in the cleaning process, Ni or Ta in the exposure surface is reduced by plasma cleaning.

In terms of another viewpoint, according to another aspect of the present invention, there is provided a manufacturing method of a light emitting-device, including: an element forming process in which a semiconductor light emitting element is formed by laminating a metal layer composed of a metallic material containing Au on a semiconductor layer including a light emitting layer that emits light by passing a current, and laminating a covering layer composed of a material containing Ni or Ta with a thickness in a range of not less than 1 nm and not more than 50 nm on the metal layer laminated on the semiconductor layer; a die-bonding process in which the semiconductor light emitting element is placed on a bonding target member via an adhesive containing a silicone resin so as to expose the covering layer, and the adhesive is heated to bond the semiconductor light emitting element to the bonding target member; and a wire-bonding process in which a wire is connected to the metal layer through the covering layer of the semiconductor light emitting element bonded to the bonding target member.

Here, the element forming process includes, after the metal layer is laminated on a partial region of the semiconductor layer to expose the semiconductor layer and the covering layer is laminated to cover the metal layer, a process for laminating a protecting layer that protects the semiconductor layer from an outside, the protecting layer being laminated on the semiconductor layer and the covering layer to expose part of the covering layer.

According to the present invention, it is possible to suppress occurrence of connection failure between the wires and electrodes of the semiconductor light emitting element.

BRIEF DESCRIPTION OF THE DRAWINGS

Exemplary embodiments of the present invention will be described in detail based on the following figures, wherein.

DETAILED DESCRIPTION

Figure 1:
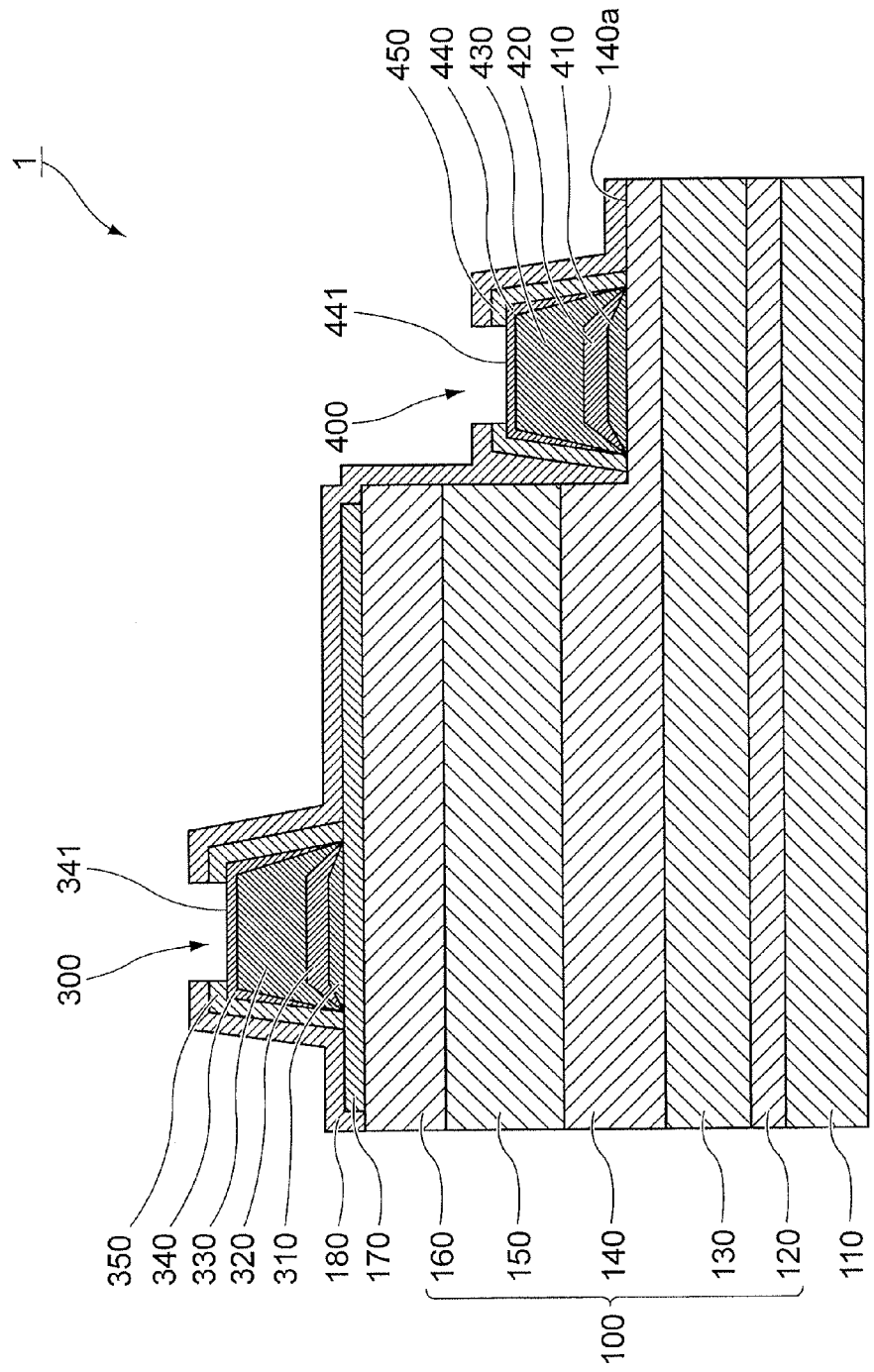
FIG. 1 is a specific example of a cross-sectional schematic view showing a semiconductor light emitting element to which an exemplary embodiment is applied.

Hereinafter, exemplary embodiments according to the present invention will be described in detail with reference to accompanying drawings. It should be noted that there are some cases where a size or a thickness of each component in the drawings that are referred to in the description below is different from a dimension of an actual semiconductor light emitting element, an actual light emitting device, and the like.

First Exemplary Embodiment

Semiconductor Light Emitting Element

FIG. 1 is a specific example of a cross-sectional schematic view showing a semiconductor light emitting element 1 to which the first exemplary embodiment is applied.

The semiconductor light emitting element 1 of the exemplary embodiment includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. It should be noted that, in the following description, these intermediate layer 120, base layer 130, n-type semiconductor layer 140, light emitting layer 150 and p-type semiconductor layer 160 will be collectively referred to as a laminated semiconductor layer 100 as necessary.

Further, the semiconductor light emitting element 1 includes a transparent conductive layer 170 laminated on the p-type semiconductor layer 160; and a p-electrode 300, which is a specific example of an electrode, laminated on part of the transparent conductive layer 170.

Still further, the semiconductor light emitting element 1 includes an n-electrode 400, which is another specific example of the electrode, laminated on part of a semiconductor layer exposure surface 140a of the n-type semiconductor layer 140, which is exposed by cutting out part of each of the p-type semiconductor layer 160, light emitting layer 150 and n-type semiconductor layer 140.

The semiconductor light emitting element 1 further includes a protecting layer 180 laminated to cover a region of the transparent conductive layer 170 on which the p-electrode 300 is not attached, a region of the p-electrode 300 except for a part (a p-side exposure surface 341, which will be described later), a region of the semiconductor layer exposure surface 140a on which the n-electrode 400 is not attached, and a region of the n-electrode 400 except for a part (an n-side exposure surface 441, which will be described later). It should be noted that the protecting layer 180 also covers wall surfaces of the n-type semiconductor layer 140, the light emitting layer 150 and the p-type semiconductor layer 160 that have been exposed by cutting out a part of each of the p-type semiconductor layer 160, the light emitting layer 150 and the n-type semiconductor layer 140.

Moreover, the p-electrode 300 includes: a p-side joining layer 310 laminated on the transparent conductive layer 170; a p-side barrier layer 320 laminated on the p-side joining layer 310; a p-side bonding layer 330 laminated on the p-side barrier layer 320; a p-side covering layer 340 laminated on the p-side bonding layer 330, part of which is not covered with the protecting layer 180 to form the p-side exposure surface 341 and is thereby exposed to the outside; and a p-side adhesive layer 350 laminated on part of the p-side covering layer 340 except for the p-side exposure surface 341. The p-side exposure surface 341 is a specific example of an exposure surface. On a surface of the p-side adhesive layer 350 opposite to a surface on which the p-side covering layer 340 is laminated, the protecting layer 180 is laminated.

On the other hand, the n-electrode 400 includes: an n-side joining layer 410 laminated on the semiconductor layer exposure surface 140a of the n-type semiconductor layer 140; an n-side barrier layer 420 laminated on the n-side joining layer 410; an n-side bonding layer 430 laminated on the n-side barrier layer 420; an n-side covering layer 440 laminated on the n-side bonding layer 430, part of which is not covered with the protecting layer 180 to form the n-side exposure surface 441 and is thereby exposed to the outside; and an n-side adhesive layer 450 laminated on part of the n-side covering layer 440 except for the n-side exposure surface 441. On a surface of the n-side adhesive layer 450 opposite to a surface on which the n-side covering layer 440 is laminated, the protecting layer 180 is laminated. The n-side exposure surface 441 is another specific example of the exposure surface.

In the semiconductor light emitting element 1, the light emitting layer 150 is configured to emit light by setting the p-side bonding layer 330 in the p-electrode 300 as a positive electrode and the n-side bonding layer 430 in the n-electrode 400 as a negative electrode to pass a current from the p-electrode 300 to the n-electrode 400 through the p-side bonding layer 330 and the n-side bonding layer 430.

It should be noted that the semiconductor light emitting element 1 is of the face-up type in which light outputted from the light emitting layer 150 is extracted from the side on which the p-electrode 300 and the n-electrode 400 are formed.

Next, each component of the semiconductor light emitting element 1 will be described in more detail.

<Substrate>

The substrate 110 can be selected to be used from various kinds of substrates without any limitation. For example, substrates composed of sapphire, silicon carbide, silicon, zinc oxide and the like can be used.

Moreover, among the above-described substrates, it is particularly preferable to use the sapphire substrate whose C-plane is a principal plane. The sapphire substrate whose C-plane is a principal plane has high transparency to light outputted from the light emitting layer 150, and in addition, by using the sapphire substrate whose C-plane is a principal plane as the substrate 110, it becomes possible to provide excellent crystallinity of the laminated semiconductor layer 100. In the case where the sapphire substrate is used, the intermediate layer 120 (buffer layer) may be formed on the C-plane of the sapphire.

Further, to improve light extraction efficiency of the semiconductor light emitting element 1, it is more preferable to use the substrate 110 in which asperity processing has been applied to a substrate surface.

<Laminated Semiconductor Layer>

The laminated semiconductor layer 100, as specific example of a semiconductor layer, is composed of, for example, a group III nitride semiconductor, which is configured by laminating the intermediate layer 120, the base layer 130, the n-type semiconductor layer 140, the light emitting layer 150 and the p-type semiconductor layer 160 on the substrate 110 in this order as shown in FIG. 1. Here, in the n-type semiconductor layer 140, an electron is a carrier, while in the p-type semiconductor layer 160, a hole is a carrier.

It should be noted that the laminated semiconductor layer 100 with excellent crystallinity can be obtained by forming by an MOCVD method, however, a sputtering method under optimized conditions can form a semiconductor layer having more excellent crystallinity than that formed by the MOCVD method. Hereinafter, description will be sequentially given to each layer of the laminated semiconductor layer 100.

Hereinafter, each of the layers constituting the laminated semiconductor layer 100 will be described in order. It should be noted that, in this specification, AlGaN, GaInN and the like are described with the compositional ratio of each element being omitted in some cases.

<Intermediate Layer>

The intermediate layer 120 has a function of mediating the difference in lattice constant between the substrate 110 and the base layer 130, and especially in the case where the substrate 110 is composed of a sapphire whose C-plane is a principal plane, serves to facilitate the formation of a single crystal layer which is C-axis oriented on the C-plane of the sapphire of the substrate 110. Consequently, if a single crystal base layer 130 is laminated on the intermediate layer 120, the base layer 130 having more excellent crystallinity can be laminated. It should be noted that formation of the intermediate layer 120 is preferably carried out in the present invention, but not necessarily needed.

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be composed of, for example, polycrystal $Al_xGa_{1-x}N$ ($0 \leq x \leq 1$) with a thickness of 0.01 μm to 0.5 μm. If the thickness of the intermediate layer 120 is less than 0.01 μm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity is decreased.

<Base Layer>

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 μm or more, more preferably 0.5 μm or more, and most preferably 1 μm or more. The base layer 130 having excellent crystallinity is likely to be obtained with these layer thickness or more.

To improve the crystallinity of the base layer 130, it is desirable that the base layer 130 is not doped with impurities. However, if conductivity of p-type or n-type is needed for the base layer 130, acceptor impurities or donor impurities can be added.

<N-Type Semiconductor Layer>

The n-type semiconductor layer 140 is preferably configured with an n-contact layer and an n-cladding layer (both not shown in the figure). It should be noted that the n-contact layer can also serve as the n-cladding layer. Further, the above-described base layer 130 may be included in the n-type semiconductor layer 140.

The n-contact layer is a layer for providing the n-electrode 400.

The n-contact layer is preferably configured with the $Al_xGa_{1-x}N$ layer ($0 \leq x < 1$, more preferably $0 \leq x \leq 0.5$, and still more preferably $0 \leq x \leq 0.1$).

Moreover, the n-contact layer is preferably doped with n-type impurities. It is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-electrode 400 can be maintained. As the n-type impurities, Si, Ge, Sn and so on are provided, and Si and Ge are preferably provided.

The thickness of the n-contact layer is preferably set to 0.5 μm to 5 μm, and more preferably set in a range of 1 μm to 3 μm. If the thickness of the n-contact layer is in the above-described ranges, crystallinity of the light emitting layer 150 or the like is suitably maintained.

It is preferable to provide the n-cladding layer between the n-contact layer and the light emitting layer 150. The n-cladding layer performs injection of the carriers into the light emitting layer 150 and confinement of the carriers.

The n-cladding layer can be formed of AlGaN, GaN, GaInN and so on. The hetero junction of these structures or the superlattice structure in which the layer is laminated plural times of these structures may also be used. In the case where the n-cladding layer is formed of GaInN, the band gap of the n-cladding layer is preferably larger than that of GaInN of the light emitting layer 150.

The n-type impurity concentration of the n-cladding layer is preferably in the range of $1 \times 10^{17}/cm^3$ to $1 \times 10^{20}/cm^3$, and more preferably in the range of $1 \times 10^{18}/cm^3$ to $1 \times 10^{19}/cm^3$. It is preferable to provide the impurity concentration in these ranges in terms of maintaining excellent crystallinity and reducing operation voltage of the element.

The thickness of the n-cladding layer is not particularly limited, but preferably in the range of 0.005 μm to 0.5 μm, and more preferably in the range of 0.005 μm to 0.1 μm.

It should be noted that, in the case where the n-cladding layer is a layer containing the superlattice structure, the layer may contain a structure in which an n-side first layer composed of the group III nitride semiconductor with a thickness of 10 nm or less and an n-side second layer composed of the group III nitride semiconductor having a composition different from that of the n-side first layer and having a thickness of 10 nm or less are laminated.

Further, the n-cladding layer may contain a structure in which the n-side first layers and the n-side second layers are alternately and repeatedly laminated, and in this case, the structure is preferably an alternating structure of GaInN and GaN or an alternating structure of GaInN having different compositions.

<Light Emitting Layer>

As the light emitting layer 150 laminated on the n-type semiconductor layer 140, a single quantum well structure or a multiple quantum well structure can be employed.

As a well layer having a quantum well structure, the group III nitride semiconductor layer composed of $Ga_{1-y}In_yN$ ($0<y<0.4$) is usually used. Moreover, in the case of employing the light emitting layer 150 having the multiple quantum well structure, the above-described $Ga_{1-y}In_yN$ is employed as the well layer, and $Al_zGa_{1-z}N$ ($0\leq z<0.3$) having a band gap energy larger than that of the well layer is employed as a barrier layer. The well layer and the barrier layer may be doped or not doped with impurities depending upon a design thereof.

<P-Type Semiconductor Layer>

The p-type semiconductor layer 160 is preferably configured with a p-cladding layer and a p-contact layer (both not shown in the figure). Further, the p-contact layer can also serve as the p-cladding layer.

The p-cladding layer performs confinement of carriers within the light emitting layer 150 and injection of carriers.

The material of p-cladding layer is not particularly limited as long as the band gap energy of the composition thereof is larger than that of the light emitting layer 150 and carriers can be confined within the light emitting layer 150, but can be composed of, for example, $Al_xGa_{1-x}N$ ($0<x\leq0.4$). It is preferable that the p-cladding layer is composed of such AlGaN in terms of confinement of carriers within the light emitting layer 150.

The p-type impurity concentration of the p-cladding layer is preferably $1\times10^{18}/cm^3$ to $1\times10^{21}/cm^3$, and more preferably $1\times10^{19}/cm^3$ to $1\times10^{20}/cm^3$. If the p-type impurity concentration is in the above ranges, excellent p-type crystals can be obtained without deteriorating crystallinity.

Further, similar to the above-described n-cladding layer, the p-cladding layer may have a superlattice structure, and in this case, it is preferable to have an alternating structure of AlGaN and another AlGaN having different compositional ratio or an alternating structure of AlGaN and GaN having different composition.

The thickness of the p-cladding layer is not particularly limited, but preferably 1 nm to 400 nm, and more preferably 5 nm to 100 nm.

The p-contact layer is a layer for providing the p-electrode 300 via the transparent conductive layer 170.

The p-contact layer is preferably composed of $Al_xGa_{1-x}N$ ($0\leq x\leq0.4$). It is preferable that Al composition is in the above-described range in terms of allowing to maintain excellent crystallinity and good ohmic contact with the p-electrode 300.

The p-type impurity concentration is preferably $1\times10^{18}/cm^3$ to $1\times10^{21}/cm^3$, and more preferably $5\times10^{19}/cm^3$ to $5\times10^{20}/cm^3$. It is preferable that the p-type impurity concentration is in the above range in a point that it becomes possible to maintain good ohmic contact, prevent cracking and maintain excellent crystallinity. The p-type impurities are not particularly limited, but, for example, Mg is preferably provided.

The thickness of the p-contact layer is not particularly limited, but is preferably 0.01 μm to 0.5 μm, and more preferably 0.05 μm to 0.2 μm. It is preferable to provide the thickness of the p-contact layer in these ranges in terms of light emission output.

<Transparent Conductive Layer>

As shown in FIG. 1, the transparent conductive layer 170 is laminated on the p-type semiconductor layer 160.

When the semiconductor light emitting element 1 is viewed in a planar view, the transparent conductive layer 170 is formed to cover almost all of the top surface of the p-type semiconductor layer 160, part of which has been removed by etching or the like so as to form the n-electrode 400. However, the transparent conductive layer 170 is not limited to such a shape, but may be formed in lattice patterns or tree patterns with some spaces in between. It should be noted that, as the structure of the transparent conductive layer 170, any structure including those known can be used without any limitation.

It is preferable that the transparent conductive layer 170 has a small contact resistance with the p-type semiconductor layer 160. Further, in the semiconductor light emitting element 1 of the exemplary embodiment, since the light from the light emitting layer 150 is extracted to the side on which the p-electrode 300 is formed, it is preferable that the transparent conductive layer 170 has excellent transparency to the light emitted from the light emitting layer 150. Further, for uniformly passing a current over the entire surface of the p-type semiconductor layer 160, it is preferable that the transparent conductive layer 170 has excellent conductivity.

From above, as the material of the transparent conductive layer 170, it is preferable to use a conductive material having optical transparency composed of conductive oxide at least containing In. Specific examples of conductive oxides containing In include: ITO (indium tin oxide ($In_2O_3$—$SnO_2$)); IZO (indium zinc oxide ($In_2O_3$—$ZnO$)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

The transparent conductive layer 170 can be formed by providing these materials by any well-known method in this technical field. Moreover, there are some cases where thermal annealing is performed for improving transparency of the transparent conductive layer 170 after forming the transparent conductive layer 170.

In the exemplary embodiment, as the transparent conductive layer 170, a crystallized structure may be used, and in particular, a transparent material containing an $In_2O_3$ crystal having a crystal structure of a hexagonal system or a bixbyite structure (for example, ITO or IZO) can be preferably used.

For instance, in the case where IZO containing the $In_2O_3$ crystal having a crystal structure of a hexagonal system is used as the transparent conductive layer 170, an amorphous IZO film that has an excellent etching property can be used and processed into a specific shape, and thereafter, processed into an electrode that is superior in optical transparency than the amorphous IZO film by transferring the amorphous state into a structure containing crystals through a heat treatment or the like. The thickness of the transparent conductive layer 170 is not particularly limited, but may be in the range of, for example, 10 nm to 500 nm.

<Protecting Layer>

The protecting layer 180 is provided to suppress ingress of water or the like into the inside of the semiconductor light emitting element 1. Further, in the exemplary embodiment, since the light from the light emitting layer 150 is extracted through the protecting layer 180, it is desirable that the protecting layer 180 has excellent transparency to the light emitted from the light emitting layer 150. Accordingly, in the exemplary embodiment, the protecting layer 180 is configured with $SiO_2$. However, the material constituting the protecting layer 180 is not limited thereto, and $TiO_2$, $Si_3N_4$, $SiO_2$—$Al_2O_3$, $Al_2O_3$, AlN or the like may be employed in place of $SiO_2$.

<P-Electrode>

Next, configuration of the p-electrode 300 will be described in detail. As described above, the p-electrode 300 includes: the p-side joining layer 310; the p-side barrier layer 320; the p-side bonding layer 330; the p-side covering layer 340; and the p-side adhesive layer 350. The p-electrode 300 also serves as a so-called bonding pad, and is configured so that a p-side bonding wire 51 is connected to the p-electrode 300 via the p-side exposure surface 341 that is exposed to the outside (refer to FIG. 2, which will be described later).

<P-Side Joining Layer>

The p-side joining layer 310 is provided between the transparent conductive layer 170 and the p-side barrier layer 320 for increasing joint strength of the p-side barrier layer 320 with respect to the transparent conductive layer 170 and for ensuring ohmic contact between the transparent conductive layer 170 and the p-side barrier layer 320.

In principle, the material of the p-side joining layer 310 may be selected as appropriate from the materials having conductivity, however, those composed of at least one element selected from the group including Al, Ti, V, Cr, Mn, Co, Zn, Ge, Zr, Nb, Mo, Ru, Hf, Ta, W, Re, Rh, Ir, Ni and Pt are preferred. In particular, by employing metals such as Cr, Ti, Mo, Ni and Co, the joint strength of the p-side barrier layer 320 with respect to the transparent conductive layer 170 can be significantly increased. Moreover, materials composed of at least one element selected from the group of valve action metals such as Ti, Nb and Ta are preferred because of high resistance to corrosion by external air or water.

Further, as shown in FIG. 1, a peripheral portion of the p-side joining layer 310 is thinner than the center portion thereof, and it is desirable to select the thickness of the center portion from the range of 1 nm to 100 nm. If the thickness of the p-side joining layer 310 is less than 1 nm, in some cases, the effect of increasing joint strength of the p-side barrier layer 320 with respect to the transparent conductive layer 170 is not sufficiently obtained. On the other hand, if the thickness of the p-side joining layer 310 exceeds 100 nm, there is a possibility that the processing time for forming the p-side joining layer 310 becomes longer though there is no change to the function of the p-side joining layer 310, and accordingly the productivity is decreased.

<P-Side Barrier Layer>

The p-side barrier layer 320 has a function of suppressing migration of elements that form the p-side joining layer 310 and a function of suppressing migration of elements (in this specific example, Au that will be described later) that form the p-side bonding layer 330. Further, the p-side barrier layer 320 has a role in increasing strength of the entire p-electrode 300. For this reason, it is preferable to use a relatively strong metallic material, for example, the material can be selected from any of Ag, Al, Ru, Rh, Pd, Os, Ir, Pt, Ti, W, Mo, Ni, Co, Zr, Hf, Ta and Nb, or alloys containing any of these metals. Among them, Al, Ag and Pt, and an alloy containing at least one of these metals are popular as materials for electrodes and excellent in terms of ease of availability or handling, and, Pt is especially preferred.

Moreover, as shown in FIG. 1, a peripheral portion of the p-side barrier layer 320 is thinner than the center portion thereof, and it is desirable to select the thickness of the center portion from the range of 20 nm to 500 nm. If the thickness of the p-side barrier layer 320 is less than 20 nm, it becomes difficult to obtain the effect of suppressing migration. On the other hand, making the p-side barrier layer 320 thicker than 500 nm generates no particular advantage and only results in a prolonged processing time and a waste of materials. More desirable thickness of the p-side barrier layer 320 is 50 nm to 200 nm.

Further, it is preferable that the p-side barrier layer 320 is in intimate contact with the p-side joining layer 310. To obtain sufficient strength in the entire p-electrode 300, it is necessary that the p-side barrier layer 320 is firmly joined to the transparent conductive layer 170 through the p-side joining layer 310. At the very least, it is preferable to be strong enough not to cause separation in a process of connecting a bonding wire to a bonding pad by usual methods.

<P-Side Bonding Layer>

The p-side bonding layer 330, as a specific example of a metal layer, is provided to be connected to the p-side bonding wire 51, to thereby supply electrical power to the p-electrode 300. An outermost layer of the p-side bonding layer 330, which is in contact with the p-side covering layer 340, is composed of Au or an alloy containing Au. In particular, it is preferable that the outermost layer of the p-side bonding layer 330 is composed of single element of Au. As the p-side bonding wire 51, Au that is excellent in electrical conductivity, ductility, corrosion resistance, and so forth is used in many cases. Accordingly, by adopting the single element of Au having good adhesiveness to the p-side bonding wire 51 composed of Au as the outermost layer of the p-side bonding layer 330, it is possible to make adhesiveness between the p-side bonding layer 330 and the bonding wire more excellent.

It should be noted that, if the outermost layer of the p-side bonding layer 330, which is in contact with the p-side covering layer 340, is composed of Au or an alloy containing Au, the p-side bonding layer 330 may have a multilayer structure of metals or a single-layer structure of Au. In this specific example, a film composed of a single-layer structure of Au is used as the p-side bonding layer 330.

As shown in FIG. 1, a peripheral portion of the p-side bonding layer 330 is thinner than the center portion thereof, and it is desirable to select the thickness of the center portion from the range of 100 nm to 2000 nm. If the thickness of the p-side bonding layer 330 is less than 100 nm, it is not preferable because the transparent conductive layer 170 is apt to be affected by mechanical damage caused in connecting the p-side bonding wire 51. On the other hand, if the thickness of the p-side bonding layer 330 is more than 2000 nm, the production time becomes longer and, as a result, cost is increased.

It should be noted that the p-side bonding layer 330 can be formed by, for example, sputtering, vapor deposition or the like.

<P-Side Covering Layer>

The p-side covering layer 340, as a specific example of a covering layer, is provided for suppressing adhesion of low-molecular siloxane dispersed from an adhesive 60 (refer to FIG. 2) to the p-side bonding layer 330 in a die-bonding process, which will be described later. The material of the p-side covering layer 340 can be selected from one of Ni and Ta, an alloy containing one of Ni and Ta, or oxide containing one of Ni and Ta. In this specific example, Ni is used as the p-side covering layer 340. It should be noted that, in a case where Ni is laminated on the p-side bonding layer 330 composed of Au, Au and Ni are alloyed in some cases. The Au—Ni alloy like this may be used as the p-side covering layer 340. In the same manner, in a case where Ta is laminated on the p-side bonding layer 330 composed of Au, Au and Ta are alloyed in some cases. The Au—Ta alloy like this may be used as the p-side covering layer 340.

Moreover, the film structure of the p-side covering layer 340 may be a continuous film that continuously covers the p-side bonding layer 330 or may be an island structure in which the p-side bonding layer 330 is dotted with Ni or Ta like islands. In a case of forming the p-side covering layer 340 by the sputtering method, for example, by using a high-pressure sputtering gas, it is possible to control the film structure of the p-side covering layer 340 to provide the island structure.

In addition, as shown in FIG. 1, the p-side covering layer 340 is provided to cover the p-side bonding layer 330, and a peripheral portion thereof is thinner than a center portion thereof. The thickness of the center portion of the p-side covering layer 340 is preferably 1 nm to 50 nm, and more preferably 5 nm to 20 nm.

If the thickness of the p-side covering layer 340 is less than 1 nm, a rate of covering the p-side bonding layer 330 with the p-side covering layer 340 is seriously reduced, and there occur some cases where adhesion of the low-molecular siloxane to the p-side bonding layer 330 cannot be suppressed sufficiently. On the other hand, if the thickness of the p-side covering layer 340 is more than 50 nm, when the p-side bonding wire 51 is connected to the p-electrode 300 (refer to FIG. 2), a tip end of the p-side bonding wire 51 is incapable of breaking through the p-side covering layer 340 to reach the p-side bonding layer 330, and accordingly, there occur some cases where p-side bonding wire 51 and p-electrode 300 are bonded insufficiently. Further, in the case where the thickness of the p-side covering layer 340 is more than 50 nm, even though the p-side bonding wire 51 and the p-side bonding layer 330 can be connected, there is a possibility of reduction of bonding strength between the p-side bonding wire 51 and the p-side bonding layer 330.

It should be noted that, as described above, the p-side covering layer 340 is not required to densely cover the surface of the p-side bonding layer 330, and the film structure of the p-side covering layer 340 may be the island structure to have a configuration in which, for example, the surface of the p-side bonding layer 330 is dotted with Ni, Ta or the like in an island state. In this manner, by causing the p-side covering layer 340 to have the island structure as the film structure thereof, when the p-side bonding wire 51 is connected to the p-electrode 300, the p-side bonding wire 51 and the p-side bonding layer 330 are easy to be brought into direct contact with each other, to thereby facilitate wire bonding; accordingly, it is possible to increase the bonding strength between the p-side bonding wire 51 and the p-side bonding layer 330.

It should be noted that, in the case where the p-side covering layer 340 has the island structure, part of the p-side bonding layer 330 is exposed from gaps in the p-side covering layer 340; however, compared to a case where the p-side covering layer 340 is not formed on the p-side bonding layer 330, it is possible to reduce an amount of the low-molecular siloxane dispersed from the adhesive 60 that adheres to the p-side bonding layer 330.

In this case, for suppressing adhesion of the low-molecular siloxane dispersed from the adhesive 60 to the p-side bonding layer 330, it is preferable to make an area of the exposed bonding layer 330 smaller than a projected area of the dispersed low-molecular siloxane.

In addition, the p-side covering layer 340 may be in a sponge-like state in which Ni or Ta is roughly laminated.

<P-Side Adhesive Layer>

The p-side adhesive layer 350 is provided for increasing joint strength of the p-side bonding layer 330 with respect to the protecting layer 180 via the p-side covering layer 340.

It is preferable that the thickness of the p-side adhesive layer 350 is selected from a range of 5 nm to 50 nm. In the case where the thickness of the p-side adhesive layer 350 is less than 5 nm, adhesive properties between the p-side bonding layer 330 and the protecting layer 180 via the p-side covering layer 340 is decreased. On the other hand, in the case where the thickness of the p-side adhesive layer 350 is more than 50 nm, working time required for lamination of the p-side adhesive layer 350 or etching for forming the p-side exposure surface 341 becomes longer, and accordingly, there is a possibility that production costs of the semiconductor light emitting element 1 is increased.

As in the exemplary embodiment, in the case where the p-side bonding layer 330 is composed of Au or an alloy containing Au and the protecting layer 180 is composed of $SiO_2$, the p-side adhesive layer 350 formed between these layers is composed of, for example, Ta, Ti, Pt, Mo, Ni or W.

It should be noted that, in this specific example, the p-side adhesive layer 350 is provided on the p-side covering layer 340; however, the p-side adhesive layer 350 is not necessarily provided, and the p-side covering layer 340 may also serve as the p-side adhesive layer 350.

As described above, the p-side covering layer 340 of the exemplary embodiment is configured with a material such as Ni or Ta. Accordingly, for example, in the case where the p-side bonding layer 330 is composed of Au or an alloy containing Au and the protecting layer 180 is composed of $SiO_2$, it becomes possible to increase the joint strength between the protecting layer 180 and the p-side bonding layer 330 by providing the p-side covering layer 340 on the p-side bonding layer 330 even in a case where the p-side adhesive layer 350 is not provided.

Moreover, owing to the p-side covering layer 340 also serving as the p-side adhesive layer 350, it becomes possible to omit a process of forming the p-side adhesive layer 350, and thereby it becomes possible to simplify the process of forming the p-electrode 300.

As described so far, the p-electrode 300 is configured with the p-side joining layer 310, p-side barrier layer 320, p-side bonding layer 330, p-side covering layer 340 and the p-side adhesive layer 350.

<N-Electrode>

Subsequently, configuration of the n-electrode 400 will be described. As described above, the n-electrode 400 includes: the n-side joining layer 410; the n-side barrier layer 420; the n-side bonding layer 430 as another specific example of the metal layer; the n-side covering layer 440 as another specific example of the covering layer; and the n-side adhesive layer 450. The n-electrode 400 also serves as a so-called bonding pad, and is configured such that a bonding wire is connected thereto via the n-side exposure surface 441 that is exposed to the outside.

In the exemplary embodiment, the n-electrode 400 has the same configuration as the p-electrode 300 except for the point that the n-electrode 400 is formed on the semiconductor layer exposure surface 140a of the n-type semiconductor layer 140. Accordingly, the n-side joining layer 410, the n-side barrier layer 420, the n-side bonding layer 430, the n-side covering layer 440 and the n-side adhesive layer 450 are configured with the same materials as the p-side joining layer 310, the p-side barrier layer 320, the p-side bonding layer 330, the p-side covering layer 340 and the p-side adhesive layer 350, respectively.

It should be noted that, similar to the p-electrode 300 as described above, the n-side adhesive layer 450 is not necessarily provided, and the n-side covering layer 440 may also serve as the n-side adhesive layer 450.

Moreover, in the exemplary embodiment, the p-side bonding layer 330 is laminated on the p-side barrier layer 320 and the n-side bonding layer 430 is laminated on the n-side barrier layer 440; however, for example, any other conductive layer may be formed between the p-side barrier layer 320 and the p-side bonding layer 330, and in the same way, any other conductive layer may be formed between the n-side barrier layer 420 and the n-side bonding layer 430.

Further, in the exemplary embodiment, the p-electrode 300 and the n-electrode 400 have the same configuration; however, the p-electrode 300 and the n-electrode 400 may have different configurations as long as the p-electrode 300 includes the p-side bonding layer 330 and the p-side covering layer 340 and as long as the n-electrode 400 includes the n-side bonding layer 430 and the n-side covering layer 440.
(Light Emitting Device)

Figure 2:
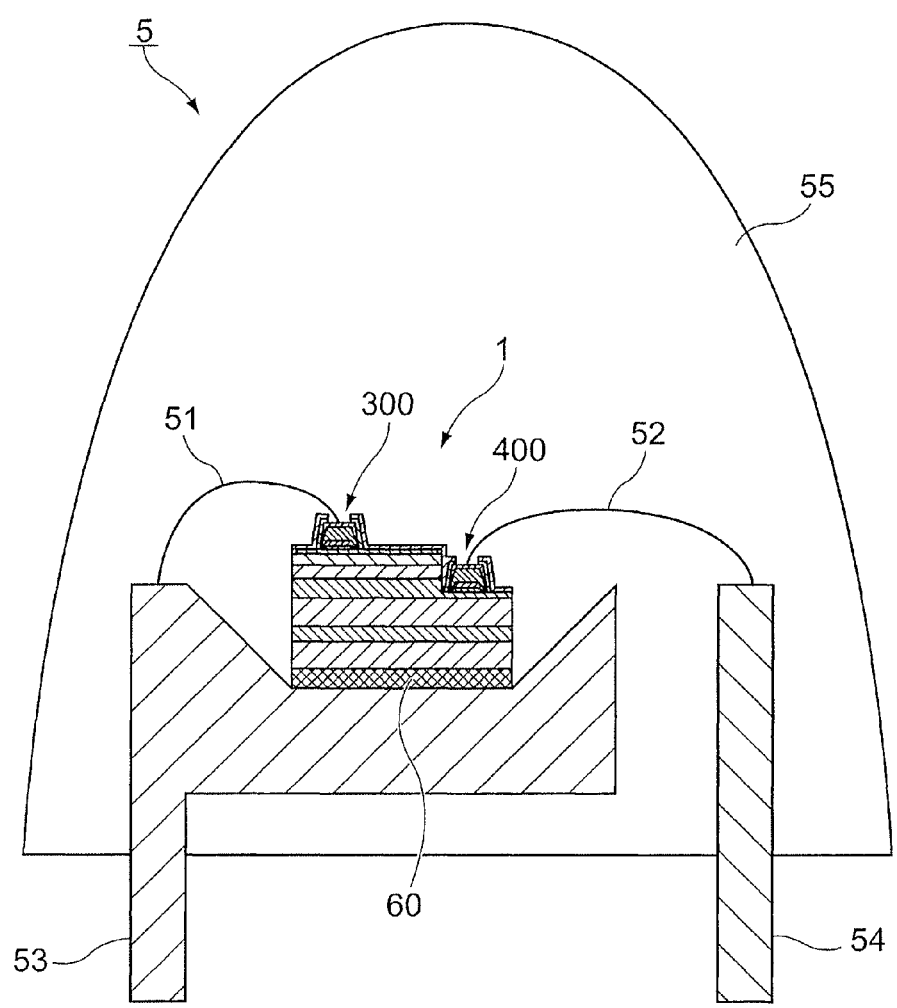
FIG. 2 is a specific example of a cross-sectional schematic view showing a light emitting device to which the exemplary embodiment is applied.

Subsequently, description will be given of a configuration of the light emitting device 5 that includes the above-described semiconductor light emitting element 1. FIG. 2 is a specific example of a cross-sectional schematic view showing the light emitting device 5 to which the exemplary embodiment is applied.

As shown in FIG. 2, the light emitting device 5 in the exemplary embodiment is of a so-called shell type. The light emitting device 5 is provided with the semiconductor light emitting element 1 mounted through the adhesive 60, and includes: a p-side frame 53 that is connected to the p-electrode 300 of the semiconductor light emitting element 1 via the p-side bonding wire 51; an n-side frame 54 that is connected to the n-electrode 400 of the semiconductor light emitting element 1 via an n-side bonding wire 52; and a mold 55 composed of a transparent resin and formed to enclose the periphery of the semiconductor light emitting element 1.

It should be noted that, as the p-side bonding wire 51 and the n-side bonding wire 52, an Au wire is used.

Moreover, in the exemplary embodiment, a thermosetting silicone-based resin is used as the adhesive 60, and the adhesive 60 is in a cured state in the light emitting device 5.

Conventionally, as the adhesive for attaching the semiconductor light emitting element 1 to the frame, an epoxy resin has been used. However, there was a possibility that the epoxy resin was discolored by light of a short wavelength (ultraviolet light and blue to green light) emitted from the semiconductor light emitting element 1, to be thereby deteriorated. On the other hand, the silicone-based resin has durability for the light of a short wavelength emitted from the semiconductor light emitting element 1, and is hardly discolored even in a case where the light emitting device 5 provided with the semiconductor light emitting element 1 is used for a long time. Consequently, in the exemplary embodiment, the thermosetting silicone-based resin is employed as the adhesive 60.

Figure 3:
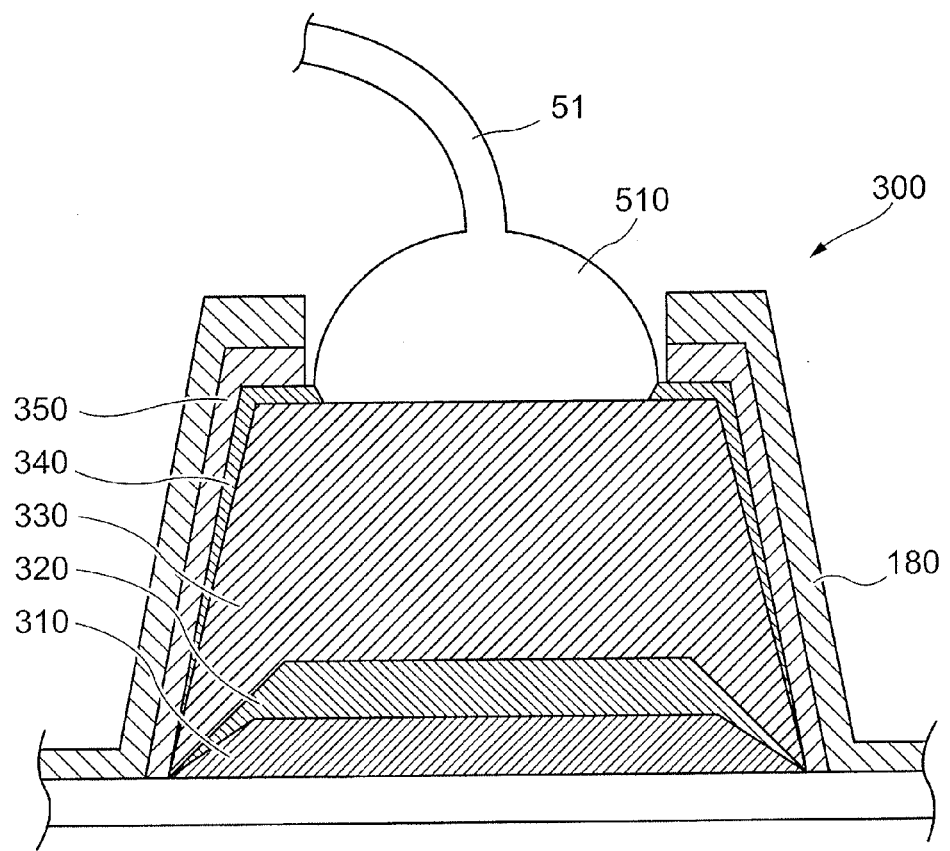
FIG. 3 is a specific example of a cross-sectional schematic view showing a connecting part between a p-electrode and a p-side bonding wire in the light emitting device shown in FIG. 2.

FIG. 3 is a specific example of a cross-sectional schematic view showing a connecting part between the p-electrode 300 and the p-side bonding wire 51 in the light emitting device 5 shown in FIG. 2.

As shown in FIG. 3, a bonding ball 510 composed of Au and provided on a tip end side of the p-side bonding wire 51 breaks the p-side covering layer 340 in the p-electrode 300 and is directly connected to the p-side bonding layer 330. In other words, Au—Au junction is achieved between the bonding ball 510 in the p-side bonding wire 51 and the p-side bonding layer 330. It should be noted that, in the n-electrode 400, a bonding ball provided on a tip end side of the n-side bonding wire 52 breaks the n-side covering layer 440 to be directly connected to the n-side bonding layer 430, though illustration is omitted.
(Manufacturing Method of Semiconductor Light Emitting Element)

Figure 4:
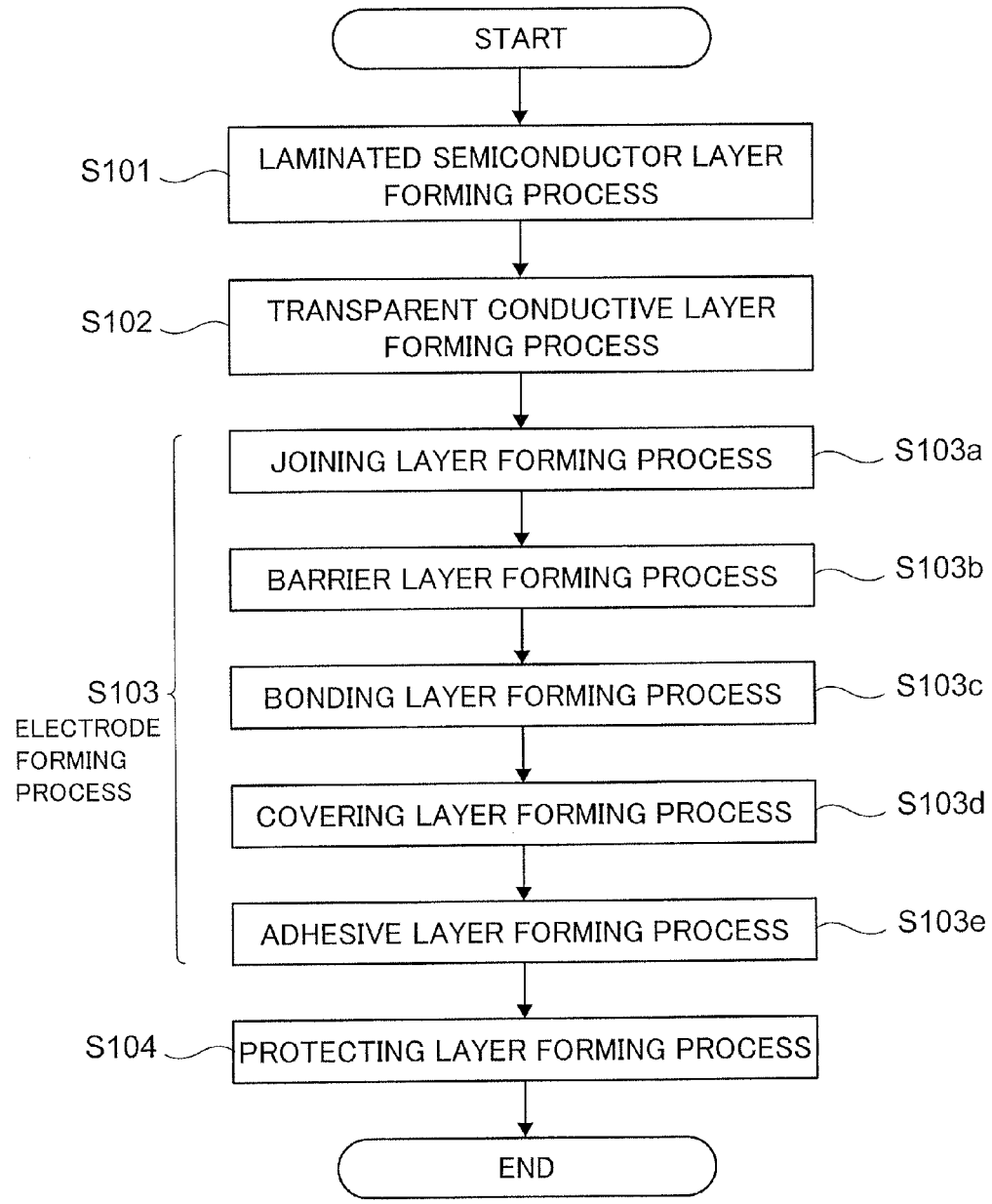
FIG. 4 is a flowchart showing a specific example of a manufacturing method of the semiconductor light emitting element.

Next, a specific example of a manufacturing method of the semiconductor light emitting element 1 shown in FIG. 1 will be described. FIG. 4 is a flowchart showing the specific example of a manufacturing method of the semiconductor light emitting element 1.

As shown in FIG. 4, the method of producing the semiconductor light emitting element 1 in the exemplary embodiment includes: a laminated semiconductor layer forming process in which the laminated semiconductor layer 100 including the light emitting layer 150 is laminated on the substrate 110, and the semiconductor layer exposure surface 140a is formed by cutting out a part of the laminated semiconductor layer 100 (step 101); a transparent conductive layer forming process in which the transparent conductive layer 170 is formed on the laminated semiconductor layer 100 (step 102); an electrode forming process in which the p-electrode 300 is formed on the transparent conductive layer 170 and the n-electrode 400 is formed on the semiconductor layer exposure surface 140a (step 103); and a protecting layer forming process in which the protecting layer 180 is formed (step 104).

The above-described electrode forming process in step 103 includes: a joining layer forming process in which the p-side joining layer 310 is formed on a part of the transparent conductive layer 170 and the n-side joining layer 410 is formed on the semiconductor layer exposure surface 140a (step 103a); a barrier layer forming process in which the p-side barrier layer 320 is formed on the p-side joining layer 310 and the n-side barrier layer 420 is formed on the n-side joining layer 410 (step 103b); a bonding layer forming process in which the p-side bonding layer 330 is formed on the p-side barrier layer 320 and the n-side bonding layer 430 is formed on the n-side barrier layer 420 (step 103c); a covering layer forming process in which the p-side covering layer 340 is formed on the p-side bonding layer 330 and the n-side covering layer 440 is formed on the n-side bonding layer 430 (step 103d); and an adhesive layer forming process in which the p-side adhesive layer 350 is formed on the p-side covering layer 340 except for the p-side exposure surface 341 and the n-side adhesive layer 450 is formed on the n-side covering layer 440 except for the n-side exposure surface 441 (step 103e).

Moreover, in some cases, the method of producing the semiconductor light emitting element 1, to which the exemplary embodiment is applied, further includes an annealing process in which heat treatment is applied to the obtained semiconductor light emitting element 1 after the adhesive layer forming process in step 103e as necessary.

Hereinafter, the above-described process of each step will be described in order.

It should be noted that, in the following description, the p-side joining layer 310 and the n-side joining layer 410 are simply referred to as a joining layer, the p-side barrier layer 320 and the n-side barrier layer 420 are simply referred to as a barrier layer, the p-side bonding layer 330 and the n-side bonding layer 430 are simply referred to as a bonding layer, the p-side covering layer 340 and the n-side covering layer 440 are simply referred to as a covering layer, and the p-side adhesive layer 350 and the n-side adhesive layer 450 are simply referred to as an adhesive layer in some cases.
<Laminated Semiconductor Layer Forming Process>

The laminated semiconductor layer forming process in step 101 will be described.

In the laminated semiconductor layer forming process, first, the substrate 110 such as a sapphire substrate is provided and is subjected to a pretreatment. The pretreatment can be carried out by, for example, placing the substrate 110 in a chamber of a sputtering device and performing sputtering on the surface of the substrate 110. Subsequent to the pretreatment, the intermediate layer 120 is formed on the substrate 110 by the sputtering method.

It should be noted that the intermediate layer 120 may be formed not only by the above-described sputtering method, but also by an MOCVD method.

Subsequently, after the intermediate layer 120 is formed, the single-crystal base layer 130 is formed on the substrate 110 on which the intermediate layer 120 has been formed. The base layer 130 may be formed by the sputtering method or by the MOCVD method.

After the base layer 130 is formed, the n-type semiconductor layer 140 is formed by laminating the n-contact layer and the n-cladding layer. The n-contact layer and the n-cladding layer may be formed by the sputtering method or by the MOCVD method.

After the n-type semiconductor layer 140 is formed, the light emitting layer 150 is formed on the top surface of the n-type semiconductor layer 140. The method of forming the light emitting layer 150 may be any of the sputtering method and the MOCVD method, but in particular, it is preferable to form the light emitting layer 150 by the MOCVD method. Specifically, the barrier layers and the well layers may be alternately and repeatedly laminated such that the barrier layers are located to face the n-type semiconductor layer 140 and the p-type semiconductor layer 160.

After the light emitting layer 150 is formed, the p-cladding layer and the p-contact layer are laminated in order to form the p-type semiconductor layer 160. The p-cladding layer and the p-contact layer may be formed by the sputtering method or by the MOCVD method.

Subsequently, prior to forming the transparent conductive layer 170, a part of the contact layer of the n-type semiconductor layer 140 is exposed by performing patterning by a known method of photolithography and performing etching of a part of the laminated semiconductor layer 100 in a predetermined region, and thereby the semiconductor layer exposure surface 140a is formed.

<Transparent Conductive Layer Forming Process>

Next, the transparent conductive layer forming process in step 102 will be described.

In the transparent conductive layer forming process, the transparent conductive layer 170 is formed by use of a known method such as the sputtering method on the p-type semiconductor layer 160, which is not removed by etching to be left, while covering the semiconductor layer exposure surface 140a with a mask or the like. It should be noted that the semiconductor layer exposure surface 140a may be formed by, after the transparent conductive layer 170 is formed on the p-type semiconductor layer 160 in advance, removing a part of the laminated semiconductor layer 100 as well as a part of the transparent conductive layer 170 by etching.

<Electrode Forming Process>

Subsequently, the electrode forming process in step 103 will be described. In the exemplary embodiment, the formation of the p-electrode 300 and the formation of the n-electrode 400 are conducted at the same time.

The electrode forming process includes the joining layer forming process in step 103a, the barrier layer forming process in step 103b, the bonding layer forming process in step 103c, the covering layer forming process in step 103d and the adhesive layer forming process in step 103e.

<Joining Layer Forming Process>

In the joining layer forming process, first, a mask is formed in which opening portions are provided at positions corresponding to a region of the transparent conductive layer 170 where the p-electrode 300 is to be formed and a region of the semiconductor layer exposure surface 140a where the n-electrode 400 is to be formed.

Subsequently, by the sputtering method, the p-side joining layer 310 is formed on the transparent conductive layer 170 and the n-side joining layer 410 is formed on the semiconductor layer exposure surface 140a. Here, the transparent conductive layer 170 and the semiconductor layer exposure surface 140a are exposed at the opening portions. At this time, by using a sputtering method with controlled sputtering conditions, the p-side joining layer 310 and the n-side joining layer 410 can be formed with increased coverage properties irrespective of a material for sputtering. In the exemplary embodiment, Ta is used as the sputtering target, and sputtering is performed under an Ar gas atmosphere.

<Barrier Layer Forming Process>

Subsequently, the p-side barrier layer 320 is formed on the p-side joining layer 310 and the n-side barrier layer 420 is formed on the n-side joining layer 410 by the sputtering method. At this time, by using a sputtering method with controlled sputtering conditions, the p-side barrier layer 320 and the n-side barrier layer 420 can be formed with increased coverage properties irrespective of a material for sputtering. In the exemplary embodiment, Pt is used as the sputtering target, and sputtering is performed under an Ar gas atmosphere.

<Bonding Layer Forming Process>

Subsequently, by the sputtering method, the p-side bonding layer 330 is formed on the p-side barrier layer 320 and the n-side bonding layer 430 is formed on the n-side barrier layer 420. At this time, by using a sputtering method with controlled sputtering conditions, the p-side bonding layer 330 and the n-side bonding layer 430 can be formed with increased coverage properties. In the exemplary embodiment, Au is used as the sputtering target, and sputtering is performed under an Ar gas atmosphere.

<Covering Layer Forming Process>

Subsequently, by using the sputtering method, the p-side covering layer 340 is formed on the p-side bonding layer 330 and the n-side covering layer 440 is formed on the n-side bonding layer 430. In the exemplary embodiment, Ni is used as the sputtering target, and sputtering is performed under the Ar gas atmosphere. For example, in a case where transition metals or the like are sputtered by a DC magnetron sputtering method, which is usually employed, if sputtering atmosphere is a low-pressure Ar gas atmosphere of the order of 1 Pa from a lower discharge limit, the film structure to be formed is apt to become a continuous film. On the other hand, if the sputtering atmosphere is a high-pressure Ar gas atmosphere of the order of several Pa, for example 10 Pa, exceeding the lower discharge limit, the film structure to be formed apt to become the island structure.

Here, it is preferable to laminate the p-side covering layer 340 with a low Ni density for enhancing ease of connection of the p-side bonding wire 51 to the p-side bonding layer 330 in a wire bonding process (refer to FIG. 5), which will be described later. In the same manner, it is also preferable to laminate the n-side covering layer 440 to have a low Ni density. Since it becomes possible to reduce the Ni density in the p-side covering layer 340 and the n-side covering density 440, it is preferable to control the sputtering gas to have high pressure for causing the p-side covering layer 340 and the n-side covering layer 440 to have the island structure.

<Adhesive Layer Forming Process>

Subsequently, by using a known method such as the sputtering method, the p-side adhesive layer 350 is formed on the p-side covering layer 340 and the n-side adhesive layer 450 is formed on the n-side covering layer 440. In the case where the p-side adhesive layer 350 and the n-side adhesive layer 450 are formed by the sputtering method, sputtering may be performed by use of Ta as the sputtering target under the Ar gas atmosphere.

It should be noted that, in the case where the p-side covering layer 340 also serves as the p-side adhesive layer 350 and the n-side covering layer 440 also serves as the n-side adhesive layer 450 as described above, the adhesive layer forming process can be omitted.

<Protecting Layer Forming Process>

Subsequently, the protecting layer forming process in step 104 will be described.

In the protecting layer forming process, the protecting layer 180 composed of SiO$_2$ is formed by the sputtering method on the region where the transparent conductive layer 170 is formed, the p-electrode, the n-electrode, and the semiconductor layer exposure surface 140a.

Then, the region except for the portions where the p-side exposure surface 341 and the n-side exposure surface 441 are formed is covered with a mask, and etching is performed on the protecting layer 180 and the adhesive layer (the p-side adhesive layer 350 and the n-side adhesive layer 450) existing at these portions to expose part of each of the p-side covering layer 340 and the n-side covering layer 440, to thereby form the p-side exposure surface 341 and the n-side exposure surface 441. Accordingly, the p-side covering layer 340 except for the p-side exposure surface 341 is covered with the p-side adhesive layer 350 and the protecting layer 180 and the p-side exposure surface 341 is exposed at the center portion of the p-side adhesive layer 350, and the n-side covering layer 440 except for the n-side exposure surface 441 is covered with the n-side adhesive layer 450 and the protecting layer 180 and the n-side exposure surface 441 is exposed at the center portion of the n-side adhesive layer 450.

It should be noted that, in the exemplary embodiment, the p-side covering layer 340 and the p-side adhesive layer 350 are configured with different materials, and the n-side covering layer 440 and the n-side adhesive layer 450 are configured with different materials, as described above. Accordingly, by controlling the etching conditions, it becomes possible to stop etching in a state where the protecting layer 180, the p-side adhesive layer 350 and the n-side adhesive layer 450 are removed, and thereby it is easily possible to obtain a state where the p-side exposure surface 341 of the p-side covering layer 340 and the n-side exposure surface 441 of the n-side covering layer 440 are exposed.

<Heat Annealing Process>

Thereafter, the semiconductor light emitting element 1 thus obtained is subjected to an annealing process in the temperature range of 150° C. or more to 600° C. or less, more preferably, 200° C. or more to 500° C. or less under a reducing atmosphere of, for example, nitrogen. The heat annealing process is conducted for increasing the adhesive properties between the transparent conductive layer 170 and the p-side barrier layer 320 with the p-side joining layer 310 interposed therebetween and the adhesive properties between the semiconductor layer exposure surface 140a and the n-side barrier layer 420 with the n-side joining layer 410 interposed therebetween.

It should be noted that the heat annealing process may be performed after the adhesive layer forming process is executed and before the protecting layer forming process is performed.

According to the above processes, the semiconductor light emitting element 1 is obtained.

(Manufacturing Method of Light Emitting Device)

Figure 5:
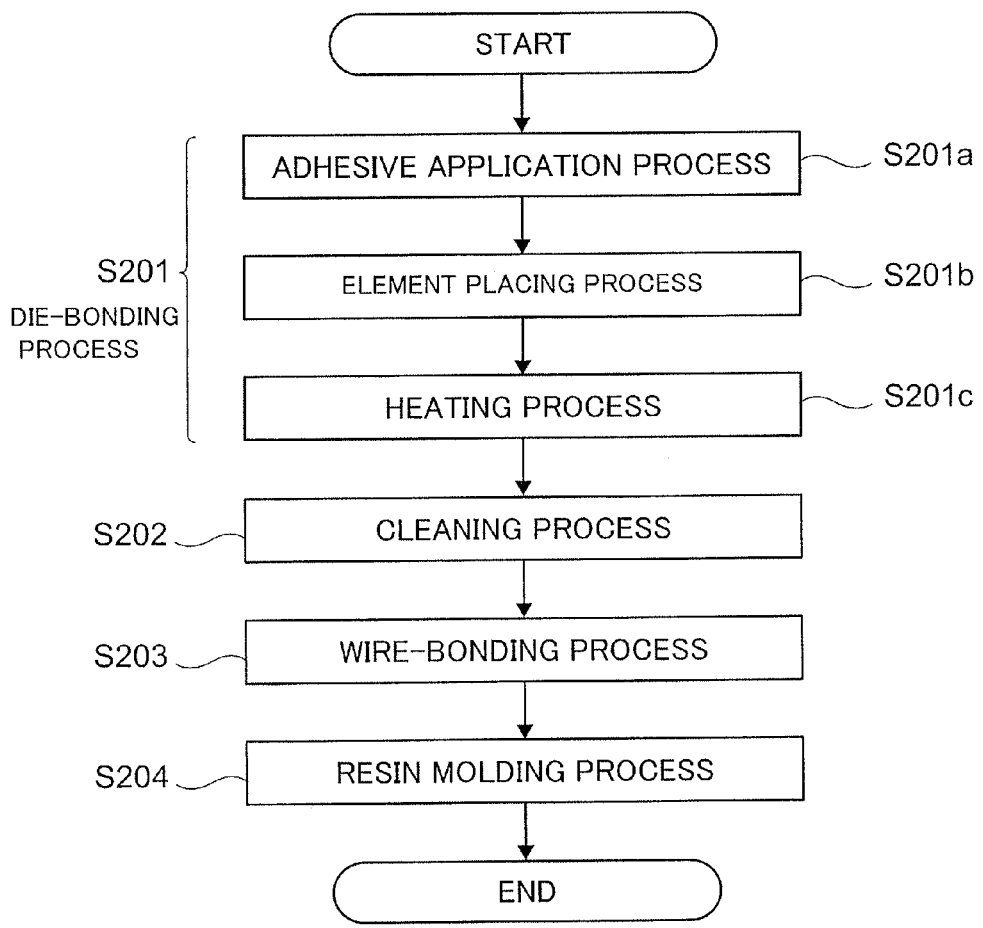
FIG. 5 is a flowchart showing a specific example of a manufacturing method of the light emitting device.

Next, description will be given of a specific example of a manufacturing method of the light emitting device 5 shown in FIG. 2. FIG. 5 is a flowchart showing the specific example of the manufacturing method of the light emitting device 5.

As shown in FIG. 5, the manufacturing method of the light emitting device 5 in the exemplary embodiment includes: a die-bonding process in which the semiconductor light emitting element 1 manufactured by the above-described method is bonded to a frame (in the exemplary embodiment, the p-side frame 53) (step 201); a cleaning process in which the p-side exposure surface 341 of the p-electrode 300 and the n-side exposure surface 441 of the n-electrode 400 in the semiconductor light emitting element 1 bonded to the frame are cleaned by plasma cleaning or the like (step 202); a wire-bonding process in which the p-side bonding wire 51 and the n-side bonding wire 52 are connected to the p-electrode 300 and the n-electrode 400 of the semiconductor light emitting element 1, respectively (step 203); and a resin molding process in which the semiconductor light emitting element 1, the p-side bonding wire 51, the n-side bonding wire 52 and part of the p-side frame 53 and n-side frame 54 are covered with a transparent resin (step 204).

It should be noted that the cleaning process in step 202 is not necessarily carried out, and after the die-boding process in step 201, the wire-bonding process in step 203 may be executed without performing the cleaning process in step 202.

Hereinafter, the above-described process of each step will be described in order.

<Die-Bonding Process>

The die-bonding process in step 201 includes: an adhesive application process in which the adhesive 60 is applied to the frame (p-side frame 53) (step 201a); an element placing process in which the semiconductor light emitting element 1 is placed on the adhesive 60 applied to the frame (step 201b); and a heating process in which the adhesive 60 is heated to be cured (step 201c).

<Adhesive Application Process>

In the adhesive application process, the adhesive 60 before curing is applied to a portion of the p-side frame 53 to which the semiconductor light emitting element 1 is bonded.

As described above, in the exemplary embodiment, the thermosetting silicone-based resin is used as the adhesive 60, and the low-molecular siloxane is contained in the silicone-based resin as an ingredient thereof.

It should be noted that the adhesive 60 may contain a solvent for viscosity control, an additive, powdered metals or the like. Moreover, a state of the adhesive 60 can be appropriately selected from various states such as a liquid and a paste.

Moreover, it is preferable to adjust an amount of the adhesive 60 applied to the p-side frame 53 so that an area of the adhesive 60 when the semiconductor light emitting element 1 is placed on the adhesive 60 in the element placing process is nearly equal to an area of a portion of the semiconductor light emitting element 1 facing the adhesive 60. If the amount of the adhesive 60 to be applied is excessively small, the semiconductor light emitting element 1 is not bonded to the p-side frame 53 in some cases. On the other hand, if the amount of the adhesive 60 to be applied is excessively large, there is a possibility that the semiconductor light emitting element 1 placed on the adhesive 60 is tilted or displaced.

<Element Placing Process>

Subsequently, in the element placing process, the semiconductor light emitting element 1 is placed on the adhesive 60 applied to the p-side frame 53 in the adhesive application process.

On this occasion, the semiconductor light emitting element 1 is arranged such that a surface of the substrate 110 of the semiconductor light emitting element 1, which is opposite to the surface on which the laminated semiconductor layer 100 is laminated, faces the adhesive 60. This exposes the p-side exposure surface 341 of the p-side covering layer 340 in the p-electrode 300 and the n-side exposure surface 441 of the n-side covering layer 440 in the n-electrode 400 upwardly in the state where the semiconductor light emitting element 1 is placed on the adhesive 60.

<Heating Process>

In the heating process, by heating the adhesive 60, the thermosetting silicone-based resin used as the adhesive 60 is cured, to thereby bond the semiconductor light emitting element 1 to the p-side frame 53. The heating temperature is, though the temperature is different according to the kinds of the silicone-based resin, for example, 150° to 170°. Moreover, time for heating the adhesive 60, an atmosphere or the like can be suitably selected according to the kinds or the like of the silicone-based resin used as the adhesive 60.

Here, as described above, the low-molecular siloxane is contained in the silicone-based resin used as the adhesive 60 as an ingredient thereof. The low-molecular siloxane has volatility from the silicone-based resin.

Accordingly, if the adhesive 60 is heated in the heating process, the low-molecular siloxane contained in the adhesive 60 is dispersed into the atmosphere. Then, the dispersed siloxane falls on the surface of the p-electrode 300 and the n-electrode 400 of the semiconductor light emitting element 1, and covers the surface of the p-electrode 300 and the n-electrode 400 in some cases.

Here, the present inventors have found that the low-molecular siloxane is particularly apt to adhere to a region where Au is exposed on the surface of the p-electrode 300 or the n-electrode 400.

In other words, in the p-electrode 300 or the n-electrode 400 of the semiconductor light emitting element 1, in the case where the bonding layer (the p-side bonding layer 330 and the n-side bonding layer 430) composed of Au or an alloy containing Au is exposed, the low-molecular siloxane dispersed from the adhesive 60 is likely to adhere to Au constituting the bonding layer and to cover the exposed surface of the bonding layer.

Further, the present inventors have found that Ni, Ta and the like have low compatibility with the low-molecular siloxane, and therefore the low-molecular siloxane hardly adheres to Ni, Ta and the like. Then, the present inventors have found that the low-molecular siloxane hardly adheres to the exposed surface of the p-electrode 300 and the n-electrode 400 by providing the covering layer (the p-side covering layer 340 and the n-side covering layer 440) composed of Ni, Ta or the like to cover the bonding layer (the p-side bonding layer 330 and the n-side bonding layer 430) composed of Au or an alloy containing Au.

To be specifically described, in the semiconductor light emitting element 1 of the exemplary embodiment, the covering layer is provided to cover the bonding layer in the p-electrode 300 and the n-electrode 400. Consequently, in the state where the semiconductor light emitting element 1 is placed on the adhesive 60 applied to the p-side frame 53, the p-side exposure surface 341 of the p-side covering layer 340 is exposed in the p-electrode 300, and the n-side exposure surface 441 of the n-side covering layer 440 is exposed in the n-electrode 400.

Then, as described above, Ni, Ta and the like constituting the covering layer of the exemplary embodiment have low compatibility with the low-molecular siloxane, and therefore the low-molecular siloxane hardly adheres to Ni, Ta and the like.

Accordingly, in the semiconductor light emitting element 1 of the exemplary embodiment, even in the case where the silicone-based resin containing the low-molecular siloxane is used as the adhesive 60 and the low-molecular siloxane is dispersed from the adhesive 60 into the atmosphere in the heating process, the low-molecular siloxane hardly adheres to the covering layer (the p-side covering layer 340 and the n-side covering layer 440). Further, the bonding layer (the p-side bonding layer 330 and the n-side bonding layer 430) composed of Au or the like, to which the low-molecular siloxane is likely to adhere, is covered with the covering layer. Consequently, it is possible to also suppress adherence of the low-molecular siloxane to the bonding layer.

As described so far, in the exemplary embodiment, it becomes possible to suppress adherence of the low-molecular siloxane dispersed from the adhesive 60 to the p-electrode 300 and the n-electrode 400.

It should be noted that, even in the case where the covering layer (the p-side covering layer 340 and the n-side covering layer 440) is formed as a film having the island structure on the bonding layer (the p-side bonding layer 330 and the n-side bonding layer 430) as described above, it is also possible to suppress adherence of the low-molecular siloxane to the bonding layer. Since the low-molecular siloxane has low compatibility with Ni, Ta or the like that constitutes the covering layer as described above, the low-molecular siloxane hardly approaches the covering layer. Accordingly, even in the case where part of the bonding layer is exposed from the covering layer having the island structure, the low-molecular siloxane hardly approaches the bonding layer exposed from the covering layer. Consequently, even in the case where the covering layer is configured as a film having the island structure, it is possible to suppress adherence of the low-molecular siloxane to the bonding layer compared to the case where the covering layer is not provided.

<Cleaning Process>

Subsequently, the cleaning process in step 202 will be described.

The cleaning process is a process for cleaning the p-side exposure surface 341 and the n-side exposure surface 441 by, for example, plasma cleaning.

The plasma cleaning is performed by, for example, placing the semiconductor light emitting element 1 bonded to the p-side frame 53 in a chamber in a vacuum state and exposing the p-side exposure surface 341 of the p-electrode 300 and the n-side exposure surface 441 of the n-electrode 400 to plasma of Ar or the like. This shaves exposed surfaces of the p-side covering layer 340 and the n-side covering layer 440 through the p-side exposure surface 341 and the n-side exposure surface 441.

By shaving the exposed surfaces of the p-side covering layer 340 and the n-side covering layer 440, soil such as the low-molecular siloxane adhered to the exposed surfaces of the p-side covering layer 340 and the n-side covering layer 440 is removed, and the thickness of the regions in the p-side covering layer 340 and the n-side covering layer 440 where the exposed surfaces are formed is reduced. Accordingly, in the wire-bonding process to be described later, the bonding wire easily breaks the covering layer to connect to the bonding layer (the p-side bonding layer 330 and the n-side bonding layer 430) when the bonding wire is to be connected to the bonding layer via the covering layer, and therefore, it becomes possible to provide excellent adhesive properties between the bonding layer and the bonding wire.

Moreover, in the cleaning process, the p-side covering layer 340 and the n-side covering layer 440 may be removed to expose part of the p-side bonding layer 330 and the n-side bonding layer 430 to the outside by adjusting conditions of the plasma cleaning.

By exposing part of the p-side bonding layer 330 and the n-side bonding layer 430 to the outside, it becomes possible to connect the bonding wire to the bonding layer (the p-side bonding layer 330 and the n-side bonding layer 430) directly in the wire-bonding process to be described later. Accordingly, it is possible to make the adhesive properties between the bonding layer and the bonding wire more excellent.

It should be noted that the cleaning process may include other pre-processing steps or post-processing steps before or after the above-described plasma cleaning is performed.

In addition, the method of cleaning the p-side exposure surface 341 of the p-side covering layer 340 and the n-side exposure surface 441 of the n-side covering layer 440 is not limited to the above-described plasma cleaning.

For example, after portions except for the p-side exposure surface 341 and the n-side exposure surface 441 are covered with a mask, the p-side exposure surface 341 and the n-side exposure surface 441 may be etched by reactive plasma or a wet method.

<Wire-Bonding Process>

Subsequently, the wire-bonding process in step 203 will be described. In the wire-bonding process, the p-side bonding wire 51 and the n-side bonding wire 52 are connected to the p-electrode 300 and the n-electrode 400, respectively, of the semiconductor light emitting element 1 that is die-bonded to the p-side frame 53.

It should be noted that Au excellent in ductility, corrosion resistance, and so forth is used as the p-side bonding wire 51 and the n-side bonding wire 52 in the exemplary embodiment. In addition, the diameter of the p-side bonding wire 51 and the n-side bonding wire 52 is of the order of 10 µm to 30 µm.

To be described specifically, first, the bonding ball 510 (refer to FIG. 3) provided at one end of the p-side bonding wire 51 is brought into contact with the p-side exposure surface 341 formed in the p-side covering layer 340 of the p-electrode 300. At this time, a load, heat and a supersonic wave are applied to the p-side bonding wire 51 and the p-electrode 300. Here, in the exemplary embodiment, the p-side covering layer 340 is formed to be thin so as to be broken on impact from the p-side bonding wire 51. Accordingly, in a case where the p-side bonding wire 51 is brought into contact with the p-side exposure surface 341 by applying a load or the like, the bonding ball 510 breaks the p-side covering layer 340 and reaches the p-side bonding layer 330, to thereby connect the p-side bonding wire 51 to the p-side bonding layer 330 electrically and mechanically.

Thereafter, the other end of the p-side bonding wire 51 is connected to the p-side frame 53.

Here, in a case where a large amount of low-molecular siloxane adheres to a surface of the p-electrode 300 (the p-side exposure surface 341), the low-molecular siloxane prevents contact between the p-side bonding wire 51 (the bonding ball 510) and the p-side bonding layer 330, and accordingly, it becomes difficult to connect the p-side bonding wire 51 to the p-side bonding layer 330 electrically and mechanically though a load or the like is applied to the p-side bonding wire 51 and the p-electrode 300.

On the other hand, in a case where a small amount of low-molecular siloxane adheres to the surface of the p-electrode, it is possible to connect the p-side bonding wire 51 to the p-side bonding layer 330 through the portions in the surface of the p-electrode 300 where the low-molecular siloxane does not exist. However, in such a case, there is a possibility that the p-side bonding wire 51 is connected to the p-side bonding layer 330 while keeping the low-molecular siloxane sandwiched between the p-side bonding wire 51 and the p-side bonding layer 330. In this case, there is a possibility of reducing the adhesive properties between the p-side bonding wire 51 and the p-electrode 300. In a case where the light emitting device 5 in which the semiconductor light emitting element 1 mounted in this way is used for a long time, the p-side bonding wire 51 is detached from the p-electrode to cause the light emitting device 5 to be incapable of emitting light in some cases.

In the exemplary embodiment, as described above, the p-side covering layer 340, to which the low-molecular siloxane hardly adheres, is provided to cover the p-side bonding layer 330 in the p-electrode 300. This makes it possible to confine the low-molecular siloxane dispersed from the adhesive 60 and adhering to the surface of the p-electrode 300 by the die-bonding process within a very small amount.

Consequently, in the wire-bonding process, it becomes possible to suppress prevention of electrical and mechanical connection between the p-side bonding layer 330 and the p-side bonding wire 51 by the low-molecular siloxane when the p-side bonding wire 51 is connected to the p-electrode 300.

Subsequently, in the same manner as the p-electrode 300 and the p-side frame 53, the n-side bonding wire 52 is also connected to the n-electrode 400 and the n-side frame 54.

In the exemplary embodiment, the n-side covering layer 440, to which the low-molecular siloxane hardly adheres, is provided to cover the n-side bonding layer 430 in the n-electrode 400, in the same way as the p-electrode 300. This makes it difficult for the low-molecular siloxane dispersed from the adhesive 60 by the die-bonding process to adhere to the surface of the n-electrode 400.

Consequently, in the wire-bonding process, it becomes possible to suppress prevention of electrical and mechanical connection between the n-side bonding layer 430 and the n-side bonding wire 52 by the low-molecular siloxane when the n-side bonding wire 52 is connected to the n-electrode 400.

<Resin Molding Process>

Subsequently, in the resin molding process in step 204, the semiconductor light emitting element 1, the p-side bonding wire 51 and the n-side bonding wire 52 that are connected to the semiconductor light emitting element 1, part of the p-side frame 53 on which the semiconductor light emitting element 1 is mounted and to which the p-side bonding wire 51 is connected, and part of the n-side frame 54 to which the n-side bonding wire 52 is connected are covered with a transparent resin to form the mold 55.

According to the above-described processes, the light emitting device 5 shown in FIG. 2 is obtained.

It should be noted that, in the exemplary embodiment, description has been given by taking, as the semiconductor light emitting element 1 applied to the light emitting device 5, the semiconductor light emitting element 1 in which the material constituting the laminated semiconductor layer 100 is composed of AlGaN, GaInN or the like and emitting green to blue light as a specific example; however, the configuration of the semiconductor light emitting element 1 is not limited thereto. For example, the semiconductor light emitting element 1 in which the material constituting the laminated semiconductor layer 100 is composed of AlInGaP or the like and emitting red light may be used.

Moreover, in the exemplary embodiment, description has been given of the light emitting device 5 in which the semiconductor light emitting element 1 is placed on the p-side frame 53 to which the p-side bonding wire 51 is electrically connected; however, the object of placing the semiconductor light emitting element 1 is not limited to the p-side frame 53. For example, the semiconductor light emitting element 1 may be placed on the n-side frame 54 to which the n-side bonding wire 52 is connected, or may be placed on another member to which the bonding wire (the p-side bonding wire 51 and the n-side bonding wire 52) is not electrically connected.

Still further, in the exemplary embodiment, description has been given of the light emitting device 5 in which a single semiconductor light emitting element 1 is placed on the p-side frame 53; however, plural semiconductor light emitting elements 1 may be placed on the p-side frame 53.

Second Exemplary Embodiment

In the first exemplary embodiment, description has been given of the device of a so-called shell type, in which the semiconductor light emitting element 1 is placed on the frame (the p-side frame 53), as a specific example of the light emitting device 5. However, the mode of the light emitting device to which the present invention is applied is not limited thereto. Subsequently, a second exemplary embodiment according to the present invention will be described. It should be noted that the same configurations as those in the first exemplary embodiment will be assigned the same signs, and detailed description thereof will be omitted.

Figure 6A:
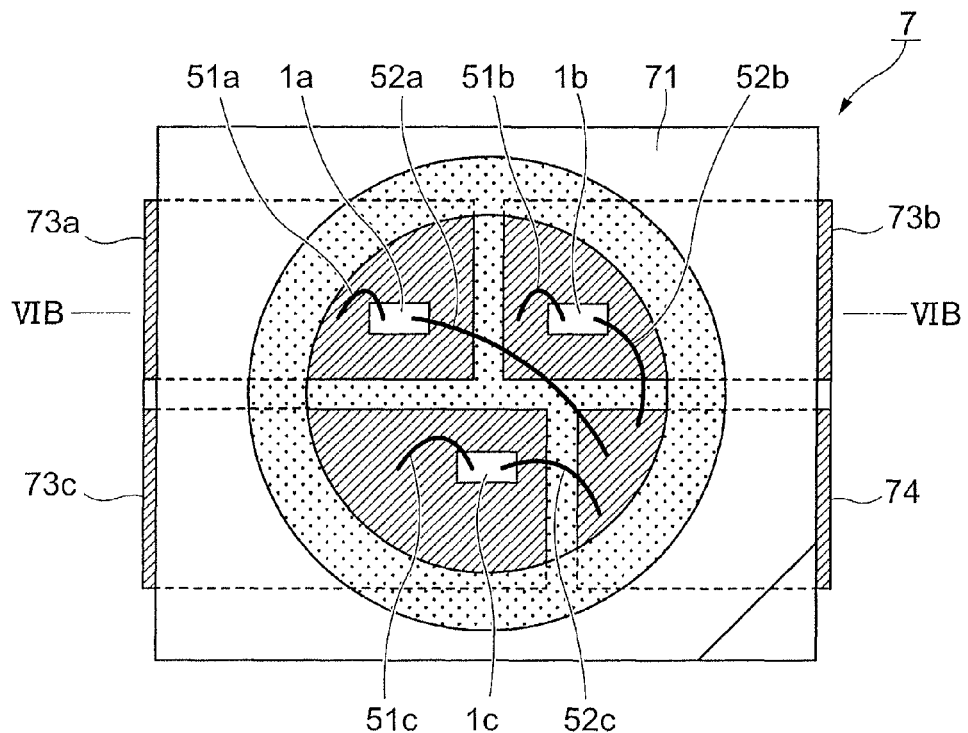
FIGS. 6A and 6B are diagrams showing the light emitting device to which the exemplary embodiment is applied.
Figure 6B:
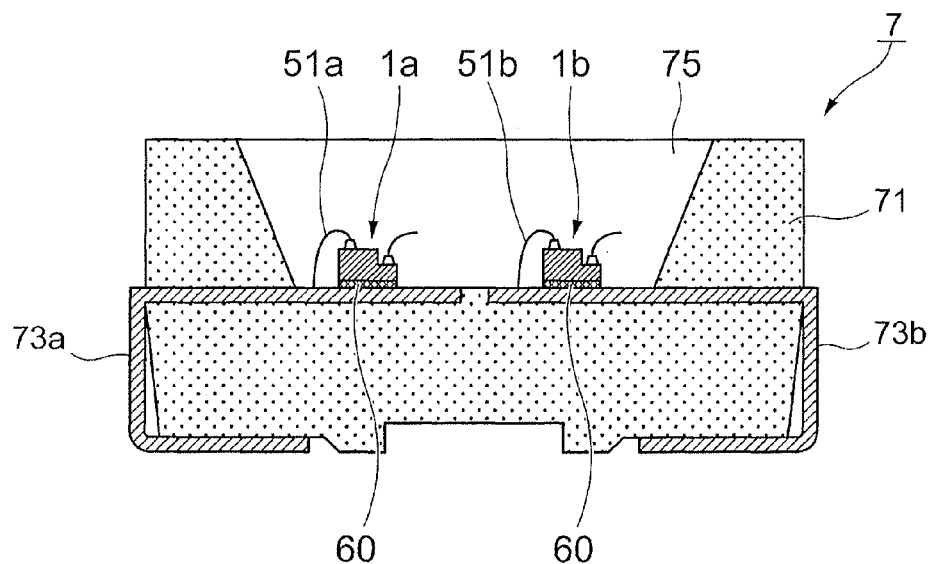

FIGS. 6A and 6B are schematic views showing a light emitting device 7 to which the exemplary embodiment is applied. FIG. 6A is a top schematic view of the light emitting device 7, and FIG. 6B is a cross-sectional view of the light emitting device 7 cut along VIB-VIB in FIG. 6A.

(Light Emitting Device)

As shown in FIGS. 6A and 6B, the light emitting device 7 is of a so-called surface-mount type.

The light emitting device 7 includes: a housing 71 in which a recessed part is formed in an upper portion thereof; p-side lead frames 73a, 73b and 73c that are provided integrally with the housing 71; and an n-side lead frame 74 that is also provided integrally with the housing 71. The light emitting device 7 also includes semiconductor light emitting elements 1a, 1b and 1c that are mounted on the p-side lead frames 73a, 73b and 73c, respectively. The light emitting device 7 further includes a sealing resin 75 provided to cover the semiconductor light emitting elements 1a, 1b and 1c.

As shown in FIG. 6B, the semiconductor light emitting element 1a is attached to the p-side lead frame 73a via the adhesive 60. Similarly, the semiconductor light emitting elements 1b and 1c are attached to the p-side lead frames 73b and 73c, respectively, via the adhesive 60. The thermosetting silicone-based resin is used as the adhesive 60, and the adhesive 60 is in the cured state in the light emitting device 7.

As shown in FIG. 6A, the semiconductor light emitting element 1a is electrically connected to the p-side lead frame 73a by a p-side bonding wire 51a and electrically connected to the n-side lead frame 74 by an n-side bonding wire 52a. The semiconductor light emitting element 1b is electrically connected to the p-side lead frame 73b by a p-side bonding wire 51b and electrically connected to the n-side lead frame 74 by an n-side bonding wire 52b. The semiconductor light emitting element 1c is electrically connected to the p-side lead frame 73c by a p-side bonding wire 51c and electrically connected to the n-side lead frame 74 by an n-side bonding wire 52c.

In the exemplary embodiment, the semiconductor light emitting element 1a includes, for example, the laminated semiconductor layer 100 composed of AlGaInP or the like, and the light emitting layer 150 that emits red light. Moreover, the semiconductor light emitting element 1b includes, for example, the laminated semiconductor layer 100 composed of GaInN or the like, and the light emitting layer 150 that emits green light. Further, the semiconductor light emitting element 1c includes, for example, the laminated semiconductor layer 100 composed of GaInN or the like, and the light emitting layer 150 that emits blue light.

It should be noted that, though illustration is omitted, each of the semiconductor light emitting elements 1a, 1b and 1c includes the p-electrode 300 and the n-electrode 400, which have the same configurations with the p-electrode 300 and the n-electrode 400 described in the first exemplary embodiment.

(Manufacturing Method of Light Emitting Device)

Subsequently, description will be given of a manufacturing method of the light emitting device 7 of the exemplary embodiment.

The manufacturing method of the light emitting device of the exemplary embodiment includes, similar to that of the first exemplary embodiment: a die-bonding process in which the semiconductor light emitting elements 1a, 1b and 1c are bonded to the lead frame (the p-side lead frames 73a, 73b and 73c), respectively; a wire-bonding process in which the p-side bonding wires 51a, 51b and 51c are bonded to the p-electrodes 300 of the semiconductor light emitting elements 1a, 1b and 1c, respectively, and the n-side bonding wires 52a, 52b and 52c are bonded to the n-electrodes 400 of the semiconductor light emitting elements 1a, 1b and 1c, respectively; and a resin molding process in which the semiconductor light emitting elements 1a, 1b and 1c are covered with a transparent resin.

<Die-Bonding Process>

In the die-bonding process, first, the housing 71 with which the p-side lead frames 73a, 73b and 73c are integrally formed is prepared. Then, the adhesive 60 before curing is applied to each of a portion of the p-side lead frame 73a to which the semiconductor light emitting element 1a is bonded, portion of the p-side lead frame 73b to which the semiconductor light emitting element 1b is bonded and a portion of the p-side lead frame 73c to which the semiconductor light emitting element 1c is bonded.

Next, the semiconductor light emitting element 1a is placed on the adhesive 60 applied to the p-side lead frame 73a. In the same manner, the semiconductor light emitting element 1b is placed on the adhesive 60 applied to the p-side lead frame 73b, and the semiconductor light emitting element 1c is placed on the adhesive 60 applied to the p-side lead frame 73c.

It should be noted that the adhesive 60 is preferably applied to each of the p-side lead frames 73a, 73b and 73c separately. In a case where the adhesive 60 is applied continuously over the p-side lead frames 73a, 73b and 73c, there is a possibility that the semiconductor light emitting elements 1a, 1b and 1c are moved by a surface tension of the adhesive 60 or the like, and thereby displaced from the bonding portions of the semiconductor light emitting elements 1a, 1b and 1c.

Subsequently, by heating the adhesive 60, the thermosetting silicone-based resin used as the adhesive 60 is cured, to thereby bond the semiconductor light emitting elements 1a, 1b and 1c to the p-side lead frames 73a, 73b and 73c. It should be noted that the heating temperature, heating time, atmosphere in heating or the like is appropriately selected in accordance with kinds of the silicone-based resin to be used as the adhesive 60 and the like.

Also in the exemplary embodiment, in the p-electrode 300 and the n-electrode 400 in each of the semiconductor light emitting elements 1a, 1b and 1c, the covering layer (the p-side covering layer 340 and the n-side covering layer 440) is provided to cover the bonding layer (the p-side bonding layer 330 and the n-side bonding layer 430). Accordingly, also in the exemplary embodiment, it becomes possible to suppress adhesion of the low-molecular siloxane dispersed from the adhesive 60 to the p-electrode 300 and the n-electrode 400 of each of the semiconductor light emitting elements 1a, 1b and 1c.

<Cleaning Process>

Subsequently, in the cleaning process, plasma cleaning is performed on the p-side exposure surface 341 of the p-electrode 300 and the n-side exposure surface 441 of the n-electrode 400 of each of the semiconductor light emitting elements 1a, 1b and 1c as necessary. Consequently, the exposed surfaces of the p-side covering layer 340 and n-side covering layer 440 of each of the semiconductor light emitting elements 1a, 1b and 1c are shaved, and accordingly, soil such as the low-molecular siloxane adhered to the exposed surfaces of the p-side covering layer 340 and the n-side covering layer 440 is removed, and the thickness of the regions in the p-side covering layer 340 and the n-side covering layer 440 where the exposed surfaces are formed is reduced. As a result, in the wire-bonding process, the bonding wire easily breaks the covering layer (the p-side covering layer 340 and the n-side covering layer 440) to connect to the bonding layer (the p-side bonding layer 330 and the n-side bonding layer 430), and therefore, excellent adhesive properties between the bonding layer and the bonding wire is provided.

<Wire-Bonding Process>

Next, in the wire-bonding process, the p-side bonding wire 51a and the n-side bonding wire 52a are connected to the p-electrode 300 and the n-electrode 400, respectively, of the semiconductor light emitting element 1a having been die-bonded to the p-side lead frame 73a. In the same manner, the p-side bonding wire 51b and the n-side bonding wire 52b are connected to the p-electrode 300 and the n-electrode 400, respectively, of the semiconductor light emitting element 1b having been die-bonded to the p-side lead frame 73b. Further, the p-side bonding wire 51c and the n-side bonding wire 52c are connected to the p-electrode 300 and the n-electrode 400, respectively, of the semiconductor light emitting element 1c having been die-bonded to the p-side lead frame 73c.

In the exemplary embodiment, as described above, the low-molecular siloxane dispersed from the adhesive 60 by the die-bonding process hardly adheres to the p-electrode 300 and the n-electrode 400 of each of the semiconductor light emitting elements 1a, 1b and 1c.

Accordingly, in the wire-bonding process, when the p-side bonding wires 51a, 51b and 51c are connected to the p-electrodes 300 of the semiconductor light emitting elements 1a, 1b and 1c, respectively, it becomes possible to suppress prevention of electrical and mechanical connection between the p-side bonding wires 51a, 51b and 51c and the p-side bonding layers 330 in the p-electrodes 300 of the semiconductor light emitting elements 1a, 1b and 1c, respectively, by the low-molecular siloxane.

Similarly, when the n-side bonding wires 52a, 52b and 52c are connected to the n-electrodes 400 of the semiconductor light emitting elements 1a, 1b and 1c, respectively, it becomes possible to suppress prevention of electrical and mechanical connection between the n-side bonding wires 52a, 52b and 52c and the n-side bonding layers 430 in the n-electrodes 400 of the semiconductor light emitting elements 1a, 1b and 1c, respectively, by the low-molecular siloxane.

<Resin Molding Process>

Subsequently, in the resin molding process, by filling the recessed part formed in the housing 71 with the transparent sealing resin 75, the semiconductor light emitting elements 1a, 1b and 1c, the p-side bonding wires 51a, 51b and 51c, and the n-side bonding wires 52a, 52b and 52c are covered with the sealing resin 75.

According to the above processes, the light emitting device 7 shown in FIGS. 6A and 6B is obtained.

It should be noted that, in the exemplary embodiment, description has been given of the light emitting device 7 in which the semiconductor light emitting elements 1a, 1b and 1c that emit light of different colors from one another are mounted on the p-side lead frames 73a, 73b and 73c, respectively; however, for example, a single semiconductor light emitting element 1 that emit light of the same color may be mounted on each of the p-side lead frames 73a, 73b and 73c. In addition, the number of semiconductor light emitting elements 1 to be mounted on the light emitting device 7 is not limited to three; the number may be one or any plural number other than three.

Moreover, in the first exemplary embodiment and the second exemplary embodiment, the semiconductor light emitting element 1 of a face-up type, in which both of the p-electrode 300 and the n-electrode 400 are formed on a light extraction surface side of the semiconductor light emitting element 1, is used as the semiconductor light emitting element 1; however, the mode of the semiconductor light emitting element 1 is not limited thereto. The present invention can be applied to, for example, the semiconductor light emitting element 1 of a double-side electrode type, in which the p-electrode 300 is formed on the light extraction surface side of the semiconductor light emitting element 1 while the n-electrode 400 is formed on a side opposite to the light extraction surface.

In this case, at least the p-electrode 300 formed on the light extraction surface needs to have the above-described configuration that includes the p-side covering layer 340. This makes it possible to suppress adherence of the low-molecular siloxane dispersed from the adhesive 60 to the exposed surface of the p-electrode 300.

Moreover, in this case, the n-electrode 400 is bonded to the frame via the adhesive 60, and accordingly, electrical power is supplied to the n-electrode 400 from the frame through the adhesive 60. Accordingly, it is preferable to use an adhesive made by mixing a metal powder or the like into a silicone-based resin to provide electrical conductivity as the adhesive 60 for bonding the semiconductor light emitting element 1 to the frame.

Examples

Subsequently, the present invention will be specifically described based on examples. However, the present invention is not limited to these examples.

The present inventors manufactured the semiconductor light emitting elements 1 with the p-side covering layer 340 in the p-electrode 300 and the n-side covering layer 440 in the n-electrode 400 having different configurations, and the semiconductor light emitting elements 1 were die-bonded and wire-bonded to be evaluated. It should be noted that, in the following examples and comparative examples, die-bonding of the semiconductor light emitting elements 1 was performed under the condition in which the density of the low-molecular siloxane was higher than usual for making the effect of the present invention clear.

To be described specifically, the plural semiconductor light emitting elements 1 were manufactured by the above-described method, and each semiconductor light emitting element 1 was placed on a metal plate (hereinafter, referred to as a lead frame) composed of the same material as the p-side frame 53 in the first exemplary embodiment via the adhesive 60 made of a silicone-based resin. Then, the plural lead frames on each of which the semiconductor light emitting element 1 was placed were set in a heating oven, and the adhesive 60 of 1 g was added to the inside of the heating oven, then a state where gas did not flow through was set. It should be noted that the adhesive 60 of 1 g was added to the inside of the heating oven for increasing the density of the low-molecular siloxane under the atmosphere in the heating oven. Subsequently, after the lead frame was left in the heating oven at a room temperature for 90 minutes, heating was performed at 150° C. for two hours to cure the adhesive 60. This brings a state where the semiconductor light emitting element 1 was die-bonded to the lead frame.

Then, the lead frames on each of which the semiconductor light emitting element 1 was die-bonded were taken out and visual inspection and wire-bonding inspection were executed on the p-electrode 300 and the n-electrode 400 in each semiconductor light emitting element 1.

It should be noted that, in this specific example, KER-3000-M2, a die-bonding agent manufactured by Shin-Etsu Chemical Co., Ltd was used as the adhesive 60.

In Table 1, relation between the material and the thickness of the covering layer (the p-side covering layer 340 and the n-side covering layer 440) and evaluation result of the semiconductor light emitting layer 1, in which the covering layer was formed, in each of Examples 1 to 12 and Comparative Examples 1 to 3 is shown.

TABLE 1

| | Material of Covering Layer | Thickness of Covering Layer (nm) | Visual Inspection (Failure Rate (%)) | Wire-Bonding Inspection (Failure Rate (%)) |
|---|---|---|---|---|
| Example 1 | Ni | 1 | 55 (55/100) | 67 (30/45) |
| Example 2 | Ni | 2 | 10 (10/100) | 20 (18/90) |
| Example 3 | Ni | 5 | 0 (0/100) | 0 (0/100) |
| Example 4 | Ni | 10 | 0 (0/100) | 0 (0/100) |
| Example 5 | Ni | 20 | 0 (0/100) | 0 (0/100) |
| Example 6 | Ni | 50 | 0 (0/100) | 5 (5/100) |
| Example 7 | Ta | 1 | 60 (60/100) | 60 (24/40) |
| Example 8 | Ta | 2 | 25 (25/100) | 20 (15/75) |
| Example 9 | Ta | 5 | 5 (5/100) | 0 (0/95) |
| Example 10 | Ta | 10 | 0 (0/100) | 0 (0/100) |
| Example 11 | Ta | 20 | 0 (0/100) | 0 (0/100) |
| Example 12 | Ta | 50 | 0 (0/100) | 10 (10/100) |
| Comparative Example 1 | — | 0 | 85 (85/100) | 100 (15/15) |
| Comparative Example 2 | Ni | 100 | 0 (0/100) | 95 (95/100) |
| Comparative Example 3 | Ta | 100 | 0 (0/100) | 90 (90/100) |

It should be noted that the visual inspection is a simple inspection to check whether or not a large amount of low-molecular siloxane adheres to the p-side exposure surface 341 of the p-electrode 300 and the n-side exposure surface 441 of the n-electrode 400 at the time when the semiconductor light emitting element 1 is die-bonded to the lead frame by the above-described method. In this specific example, the p-side exposure surface 341 of the p-electrode 300 and the n-side exposure surface 441 of the n-electrode 400 of the semiconductor light emitting element 1 were observed by a stereoscopic microscope at the time when the die-bonding was completed and before the wire-bonding was performed. In a case where a large amount of low-molecular siloxane adhered to the p-side exposure surface 341 or the n-side exposure surface 441, adherence marks of the low-molecular siloxane are observed on the p-side exposure surface 341 or the n-side exposure surface 441. In this inspection, the adherence marks of the low-molecular siloxane formed on the p-side exposure surface 341 or the n-side exposure surface 441 were visually confirmed by the stereoscopic microscope, and from the observation result, it was determined whether the semiconductor light emitting element 1 was defective or non-defective.

In Table 1, a failure occurrence rate (%) when the visual inspection was performed on 100 semiconductor light emitting elements 1 is shown.

The wire-bonding inspection is an inspection that performs the wire-bonding process on the semiconductor light emitting element 1 in which the adherence marks of the low-molecular siloxane were not observed by the above-described visual inspection after finishing the die-bonding to check whether or not the bonding wire (the p-side bonding wire 51 and the n-side bonding wire 52) is normally connected to the p-electrode 300 and the n-electrode 400. It should be noted that, in this specific example, the cleaning process is not performed.

In this specific example, connection of the bonding wire to the p-electrode 300 and the n-electrode 400 was performed while applying a load, heat and a supersonic wave, and the semiconductor light emitting element 1 in which the bonding wire was not connected to the p-electrode 300 or the n-electrode 400, or the semiconductor light emitting element 1 in which the bonding strength of the bonding wire with respect to the p-electrode 300 or the n-electrode 400 was less than a specified value was regarded to be defective. It should be noted that an Au wire was used as the bonding wire.

In Table 1, a failure occurrence rate (%) in performing the wire-bonding inspection on the semiconductor light emitting elements 1 in which the adherence marks of the low-molecular siloxane were not observed by the visual inspection is shown.

In Examples 1 to 6 and Comparative Example 2, the material of the covering layer (the p-side covering layer 340 and the n-side covering layer 440) was Ni, and thickness of the covering layer was varied.

In Examples 7 to 12 and Comparative Example 3, the material of the covering layer was Ta, and thickness of the covering layer was varied.

It should be noted that the covering layer is not formed in Comparative Example 1 (the thickness of the covering layer is 0 nm).

Subsequently, description will be given of the evaluation results of the semiconductor light emitting element 1 in Examples 1 to 12 and Comparative Examples 1 to 3.

First, the evaluation results by the visual inspection will be described. As shown in Table 1, the failure occurrence rate in the visual inspection was not more than 60% in Examples 1 to 12, and the failure occurrence rate in the visual inspection was 85% in Comparative Example 1. That is, in Examples 1 to 12, the failure occurrence rate in the visual inspection was low compared to Comparative Example 1. Accordingly, it was confirmed that adherence of the low-molecular siloxane to the p-side exposure surface 341 of the p-electrode 300 and the n-side exposure surface 441 of the n-electrode 400 was suppressed by providing the covering layer (the p-side covering layer 340 and the n-side covering layer 440) containing Ni or Ta to the p-electrode 300 and the n-electrode 400 in comparison with the case where the covering layer was not formed on the p-electrode 300 and the n-electrode 400.

Moreover, of Examples 1 to 12, the failure occurrence rate in the visual inspection was 0% in Examples 3 to 6 and 10 to 12. That is, it was confirmed that adherence of the low-molecular siloxane to the p-side exposure surface 341 of the p-electrode 300 and the n-side exposure surface 441 of the n-electrode 400 was further suppressed by setting the thickness of the covering layer to 5 nm to 50 nm in the case where the covering layer was composed of Ni, while setting the thickness of the covering layer to 10 nm to 50 nm in the case where the covering layer was composed of Ta.

In Examples 1, 2 and 7 to 9, since the covering layer is thin compared to those in Examples 3 to 6 and 10 to 12, the covering rate of part of the covering layer with respect to the bonding layer is seriously reduced and part of the bonding layer is exposed to the outside in some cases. Since the low-molecular siloxane is likely to adhere to the exposed bonding layer, it is considered that the failure occurrence rate in the visual inspection is increased in Examples 1, 2 and 7 to 9 compared to Examples 3 to 6 and 10 to 12.

It should be noted that the failure occurrence rate in the visual inspection was 0% in Comparative Examples 2 and 3, and thereby it was confirmed that adherence of the low-molecular siloxane to the p-side exposure surface 341 of the p-electrode 300 and the n-side exposure surface 441 of the n-electrode 400 was suppressed.

Subsequently, the evaluation results by the wire-bonding inspection will be described. As shown in Table 1, the failure occurrence rate in the wire-bonding inspection was not more than 70% in Examples 1 to 12, and the failure occurrence rate in the wire-bonding inspection was not less than 90% in Comparative Examples 1 to 3. That is, in Examples 1 to 12, the failure occurrence rate in the wire-bonding inspection was low compared to Comparative Examples 1 to 3.

Accordingly, it was confirmed that occurrence of connection failure between the bonding wire and the p-electrode 300 and the n-electrode 400 was suppressed in the semiconductor light emitting element 1 after being die-bonded to the lead frame by use of the adhesive 60 of the silicone-based resin by providing the covering layer with a thickness of 1 nm to 50 nm on the p-electrode 300 and the n-electrode 400.

In particular, of Examples 1 to 12, the failure occurrence rate in the wire-bonding inspection was 0% in Examples 3 to 5 and 9 to 11. That is, it was confirmed that occurrence of connection failure between the bonding wire and the p-electrode 300 and the n-electrode 400 was further suppressed by setting the thickness of the covering layer to 5 nm to 20 nm.

The reason is considered that, if the thickness of the covering layer is in the above-described range, when the bonding wire is to be connected to the electrode, the bonding wire easily breaks the covering layer to reach the bonding layer, and thereby the bonding wire and the bonding layer are likely to connect directly.

It should be noted that, in Comparative Example 1, the failure occurrence rate in the wire-bonding inspection is 100%, that is, all the semiconductor light emitting elements 1, in which adherence of the low-molecular siloxane was not observed in the visual inspection, are determined to be defective in the wire-bonding inspection. Here, in Comparative Example 1, the covering layer is not provided on the electrode surface. Accordingly, it is considered that, even on the exposed surface of the electrode of the semiconductor light emitting element 1 where the adherence marks of the low-molecular siloxane were not observed by the visual inspection, the low-molecular siloxane of a very small amount adhered, which cannot be observed as the adherence marks by the stereoscopic microscope used in the visual inspection. Then, it is considered that the connection between the bonding wire and the electrode was prevented by such a very small amount of low-molecular siloxane, and therefore the failure occurrence rate in the wire-bonding inspection was increased in Comparative Example 1.

Moreover, in Comparative Examples 2 and 3, the thickness of the covering layer is 100 nm, which is thicker than those in Examples 1 to 12. Accordingly, it is considered that, in Comparative Examples 2 and 3, it is difficult for the bonding wire to break the covering layer when the bonding wire is to be connected; therefore direct connection of the bonding wire to the bonding layer is prevented and the failure occurrence rate in the wire-bonding inspection was increased.

Subsequently, when Examples 1 to 6 are compared with Examples 7 to 12 with respect to the results in the visual inspection and the wire-bonding inspection, in the case where the covering layer has the same thickness, the failure occurrence rate was low in Examples 1 to 6, in which Ni was used for the covering layer, compared to Examples 7 to 12, in which Ta was used for the covering layer. Accordingly, it was confirmed that Ni is more preferable to be used as the covering layer.

As described so far, it was confirmed that, by providing the covering layer containing Ni or Ta with a thickness of 1 nm to 50 nm on the p-electrode 300 and the n-electrode 400 of the semiconductor light emitting element 1, adherence of the low-molecular siloxane to the p-electrode 300 and the n-electrode 400 was suppressed, and thereby occurrence of connection failure between the bonding wire and the p-electrode 300 and the n-electrode 400 was suppressed even in the case where the semiconductor light emitting element 1 was die-bonded by use of the adhesive 60 composed of the silicone-based resin.

In particular, in the case where the thickness of the covering layer was 5 nm to 20 nm, it was confirmed that adherence of the low-molecular siloxane to the p-electrode 300 and the n-electrode 400 was further suppressed, and thereby occurrence of connection failure between the bonding wire and the p-electrode 300 and the n-electrode 400 was further suppressed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A manufacturing method of a light-emitting device, comprising:
 a die-bonding process in which a semiconductor light emitting element is placed on a bonding target member via an adhesive containing a silicone resin such that a surface of the semiconductor light emitting element opposite to an exposure surface faces the bonding target member, and the adhesive is heated to bond the semiconductor light emitting element to the bonding target member, the semiconductor light emitting element including a semiconductor layer including a light emitting layer that emits light by passing a current, and an electrode including a metal layer composed of a metallic material containing Au and provided on the semiconductor layer and a covering layer composed of a material containing Ni or Ta and covering the metal layer, a thickness of the covering layer being set smaller than 100 nm and the exposure surface for exposing the covering layer to an outside being formed; and a wire-bonding process in which a wire is connected to the exposure surface in the electrode of the semiconductor light emitting element bonded to the bonding target member.

2. The manufacturing method of a light-emitting device according to claim 1, wherein, in the wire-bonding process, the wire breaks the covering layer and is connected to the metal layer of the semiconductor light emitting element.

3. The manufacturing method of a light-emitting device according to claim 1, wherein, in the die-bonding process, the semiconductor light emitting element, in which a film structure of the covering layer in the electrode is an island structure, is bonded to the bonding target member.

4. The manufacturing method of a light-emitting device according to claim 1, wherein, in the wire-bonding process, the wire composed of a metallic material containing Au is connected to the electrode.

5. The manufacturing method of a light-emitting device according to claim 1, further comprising a cleaning process after executing the die-bonding process and before executing the wire-bonding process, the cleaning process cleaning the exposure surface of the electrode in the semiconductor light emitting element bonded to the bonding target member.

6. The manufacturing method of a light-emitting device according to claim 5, wherein the cleaning process includes a process for reducing Ni or Ta in the exposure surface.

7. The manufacturing method of a light-emitting device according to claim 6, wherein, in the cleaning process, Ni or Ta in the exposure surface is reduced by plasma cleaning.

8. A manufacturing method of a light-emitting device, comprising:

an element forming process in which a semiconductor light emitting element is formed by laminating a metal layer composed of a metallic material containing Au on a semiconductor layer including a light emitting layer that emits light by passing a current, and laminating a covering layer composed of a material containing Ni or Ta with a thickness in a range of not less than 1 nm and not more than 50 nm on the metal layer laminated on the semiconductor layer;

a die-bonding process in which the semiconductor light emitting element is placed on a bonding target member via an adhesive containing a silicone resin so as to expose the covering layer, and the adhesive is heated to bond the semiconductor light emitting element to the bonding target member; and a wire-bonding process in which a wire is connected to the metal layer through the covering layer of the semiconductor light emitting element bonded to the bonding target member.

9. The manufacturing method of a light-emitting device according to claim 8, wherein the element forming process includes, after the metal layer is laminated on a partial region of the semiconductor layer to expose the semiconductor layer and the covering layer is laminated to cover the metal layer, a process for laminating a protecting layer that protects the semiconductor layer from an outside, the protecting layer being laminated on the semiconductor layer and the covering layer to expose part of the covering layer.

* * * * *